US012628553B2

(12) United States Patent
Li

(10) Patent No.: US 12,628,553 B2
(45) Date of Patent: May 12, 2026

(54) QUANTUM DOT MATERIAL COMPRISING QUANTUM DOT AND FIRST LIGAND CONNECTED TO SURFACE OF QUANTUM DOT, LIGHT-EMITTING DEVICE COMPRISING INNER GROUP OF QUANTUM DOT MATERIAL AND MANUFACTURING METHOD THEREFOR, AND DISPLAY APPARATUS

(71) Applicant: BOE Technology Group Co., Ltd., Beijing (CN)

(72) Inventor: Zhuo Li, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 373 days.

(21) Appl. No.: 18/036,386

(22) PCT Filed: Dec. 25, 2020

(86) PCT No.: PCT/CN2020/139540
§ 371 (c)(1),
(2) Date: May 10, 2023

(87) PCT Pub. No.: WO2022/134039
PCT Pub. Date: Jun. 30, 2022

(65) Prior Publication Data
US 2024/0032412 A1 Jan. 25, 2024

(51) Int. Cl.
*H10K 85/60* (2023.01)
*C09K 11/02* (2006.01)
(Continued)

(52) U.S. Cl.
CPC ............ *H10K 85/654* (2023.02); *C09K 11/02* (2013.01); *C09K 11/623* (2013.01);
(Continued)

(58) Field of Classification Search
CPC ............... H10K 85/654; H10K 85/111; H10K 50/115; H10K 71/421; H10K 59/35;
(Continued)

(56) References Cited

U.S. PATENT DOCUMENTS 6,310,189 B1 * 10/2001 Fodor ................... C07C 229/14 536/25.31
6,506,558 B1 * 1/2003 Fodor ................ G11C 13/0019 506/16

(Continued)

*Primary Examiner* — Caleb E Henry
(74) *Attorney, Agent, or Firm* — IPro, PLLC

(57) ABSTRACT

Disclosed in embodiments of the present invention are a quantum dot material, a light-emitting device and a manufacturing method therefor, and a display apparatus. The quantum dot material comprises: a quantum dot and at least one first ligand connected to the surface of the quantum dot. The first ligand comprises: an inner group connected to the quantum dot, a first photosensitive group connected to the inner group, and an outer group connected to the first photosensitive group, the inner group being configured to adsorb the quantum dot material on the surface of a carrier film layer, the first photosensitive group being configured to break under the irradiation of ultraviolet light, such that the outer group is separated from the inner group, and the outer group being configured to ionize in an aqueous solution to make the quantum dot material electropositive or electronegative.

20 Claims, 10 Drawing Sheets

(51) Int. Cl.
*C09K 11/62* (2006.01)
*C09K 11/70* (2006.01)
*H10K 50/115* (2023.01)
*H10K 71/40* (2023.01)
*H10K 85/10* (2023.01)

(52) U.S. Cl.
CPC .......... *C09K 11/703* (2013.01); *H10K 85/111* (2023.02); *H10K 50/115* (2023.02); *H10K 71/421* (2023.02)

(58) Field of Classification Search
CPC ................. H10K 71/211; H10K 71/00; H10K 2102/331; H10K 59/12; C09K 11/02; C09K 11/623; C09K 11/703; C09K 11/025; C09K 11/70; C09K 11/06; C09K 11/883; B82Y 20/00; B82Y 40/00; B82Y 30/00; G03F 7/0042; G03F 7/004; G09F 9/33; H01L 33/504; H01L 25/0753; H01L 33/58; H01L 33/54; H01L 2933/0091; H01L 33/56; H01L 33/50
See application file for complete search history.

(56) References Cited

U.S. PATENT DOCUMENTS 7,294,449 B1 * 11/2007 Gudeman ............. G03F 7/0047 430/270.1
8,343,627 B2 * 1/2013 Zhong .............. G01N 33/54326 428/403
9,812,004 B1 * 11/2017 Boshernitzan ......... G08C 17/02
9,831,706 B2 * 11/2017 MacWilliams ........... H02J 7/32
9,874,693 B2 * 1/2018 Baiocco ............. G02B 6/12004
9,943,840 B2 * 4/2018 Shaffer ................... C09C 1/043
11,453,820 B2 * 9/2022 Zhang .................... C09D 11/50
12,187,935 B1 * 1/2025 Ganapathiappan .. C09K 11/883
2007/0134699 A1 * 6/2007 Glover, III ........... B01J 19/0046 977/924
2010/0068522 A1 * 3/2010 Pickett ................... B82Y 30/00 977/773
2010/0113813 A1 * 5/2010 Pickett ...................... C09C 3/08 977/774
2010/0213438 A1 * 8/2010 Cho ..................... H10K 50/156 438/47
2011/0006269 A1 * 1/2011 Petruska ................ C01G 15/00 977/773
2011/0037029 A1 * 2/2011 Liu .................... C08G 65/3322 252/500
2011/0294995 A1 * 12/2011 Huo ........................ C08L 33/02 977/773
2012/0270231 A1 * 10/2012 Smith .................. C09K 11/584 435/7.1
2012/0280345 A1 * 11/2012 Zhu ...................... G02B 6/1226 257/E31.127
2013/0004522 A1 * 1/2013 Dvir ..................... A61K 9/5138 424/178.1
2013/0146854 A1 * 6/2013 Dong ..................... H10K 50/11 438/45
2013/0345458 A1 * 12/2013 Freeman .............. C09K 11/883 556/439
2014/0027816 A1 * 1/2014 Cea ...................... H10D 62/822 257/E29.085
2014/0197507 A1 * 7/2014 Assefa .................. H10F 39/807 438/69
2015/0031217 A1 * 1/2015 Naasani ............... C09K 11/883 438/780
2015/0091093 A1 * 4/2015 Bouche ................ H10D 64/251 257/369
2015/0267106 A1 * 9/2015 Pillay Narrainen ... C09K 11/02 252/301.36
2015/0268417 A1 * 9/2015 Assefa ................. G02B 6/4257 385/14
2018/0298154 A1 * 10/2018 Lundorf .................. C04B 35/48
2019/0112527 A1 * 4/2019 Moriyama ........... C09K 11/025
2019/0302615 A1 * 10/2019 Krysak ................. G03F 7/0043
2020/0131435 A1 * 4/2020 Pousthomis ........... C09D 11/50
2020/0332181 A1 * 10/2020 Zhang ..................... C09D 11/50
2021/0062086 A1 * 3/2021 Sun ........................ C03C 14/006
2021/0179939 A1 * 6/2021 Stokes ................. C09K 11/565
2022/0102420 A1 * 3/2022 Ono ........................ C01G 21/21
2022/0169922 A1 * 6/2022 Chen ...................... C09K 11/06

* cited by examiner

QUANTUM DOT MATERIAL COMPRISING QUANTUM DOT AND FIRST LIGAND CONNECTED TO SURFACE OF QUANTUM DOT, LIGHT-EMITTING DEVICE COMPRISING INNER GROUP OF QUANTUM DOT MATERIAL AND MANUFACTURING METHOD THEREFOR, AND DISPLAY APPARATUS

The present application is a National Stage of International Application No. PCT/CN2020/139540, filed on Dec. 25, 2020, which is hereby incorporated by reference in its entirety.

FIELD

The present disclosure relates to the technical field of display, in particular to a quantum dot material, a light-emitting device and a manufacturing method therefor, and a display apparatus.

BACKGROUND

Quantum dots (QDs), also known as semiconductor nanocrystals and semiconductor nanoparticles, refer to nanosolid materials that have sizes in the order of nanometers in three dimensions of space or are composed of QDs as basic units, and are aggregates of atoms and molecules on a nanoscale. A light-emitting diode based on the quantum dots is called a quantum dot light-emitting diode (QLED), and is a novel light-emitting device.

SUMMARY

A quantum dot material provided by an embodiment of the present disclosure, includes: a quantum dot and at least one first ligand connected to a surface of the quantum dot, wherein the first ligand includes: an inner group connected to the quantum dot, a first photosensitive group connected to the inner group, and an outer group connected to the first photosensitive group; and the inner group is configured to adsorb the quantum dot material on a surface of a carrier film layer, the first photosensitive group is configured to break under irradiation of ultraviolet light, such that the outer group is separated from the inner group, and the outer group is configured to ionize in an aqueous solution to make the quantum dot material electropositive or electronegative.

Optionally, in the above quantum dot material provided by the embodiment of the present disclosure, a structural formula of the inner group is $R_1$-$R_2$-$R_3$, wherein, $R_1$ includes —S, —NH, —P or —$PO_2$, $R_2$ is polyethylene oxide or polyethylene glycol, $R_3$ is a group obtained after a high-effective and specific chemical reaction of a first group, and the first group includes an azide group, a mercapto group, an amino group, a carboxyl group, an alkyne group, an olefin group, a succinimidyl ester group, a maleimide group, an isothiocyanic acid group, a tetrafluorophenyl ester group, a sulfonated tetrafluorophenyl ester group, a diamide group, a hydroxylamine group or a carbodiimide group.

Optionally, in the above quantum dot material provided by the embodiment of the present disclosure, a structural formula of the first photosensitive group is

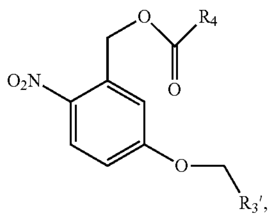

wherein, $R_3$' is a group obtained after a high-effective and specific chemical reaction between a second group and the first group, and the second group includes an alkyne group, an olefin group, a succinimidyl ester group, a maleimide group, an isothiocyanic acid group, a tetrafluorophenyl ester group, a sulfonated tetrafluorophenyl ester group, a diamide group, a hydroxylamine group or a carbodiimide group, an azide group, a mercapto group, an amino group or a carboxyl group; and $R_4$ is a group obtained after a polymerization reaction initiated by alkane with halogen atoms as an initiator.

Optionally, in the above quantum dot material provided by the embodiment of the present disclosure, in the alkane with the halogen atoms, carbon atoms connected to the halogen atoms are further at least connected to two methyl groups.

Optionally, in the above quantum dot material provided by the embodiment of the present disclosure, the alkane with the halogen atoms includes bromopropane.

Optionally, in the above quantum dot material provided by the embodiment of the present disclosure, the outer group includes polyacrylate or derivatives thereof, derivatives of polystyrene, or polyvinylpyridine.

Optionally, in the above quantum dot material provided by the embodiment of the present disclosure, when the outer group includes the polyacrylate or the derivatives thereof, the outer group is

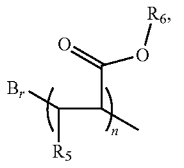

wherein, n≥3, $R_5$ is H or an alkane group, $R_6$ is H, or $R_6$ is

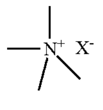

or derivatives thereof, and $X^-$ is $F^-$, $Cl^-$, $Br^-$, $I^-$, $ClO_4^-$, SCN or $HSO_3^-$; when the outer group is the derivatives of the polystyrene, the outer group is

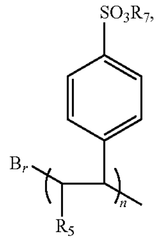

wherein, n≥3, $R_5$ is H or an alkane group, and $R_7$ is Li, Na, K, Rb, or Cs; or when the outer group is the polyvinylpyridine, the outer group is

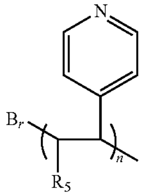

or

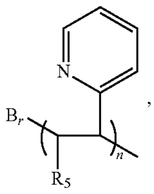

, wherein, $R_5$ is H or an alkane group, and n≥3.

Optionally, in the above quantum dot material provided by the embodiment of the present disclosure, the first ligand includes:

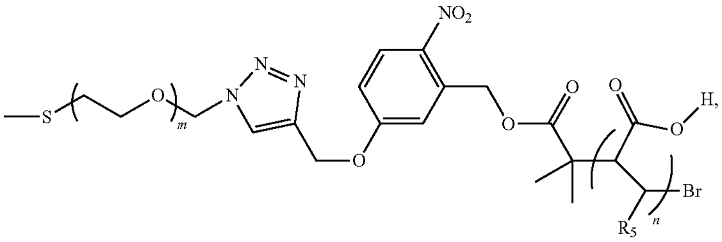

or

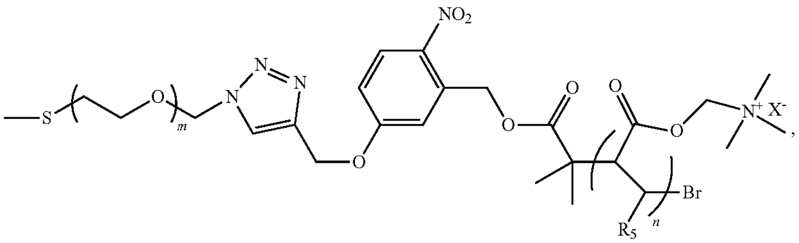

$X^-$ is $F^-$, $Cl^-$, $Br^-$, $I^-$, $ClO_4^-$, $SCN^-$ or $HSO_3^-$, or

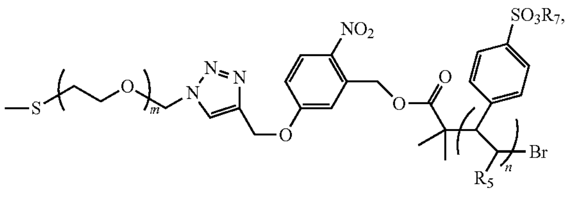

$R_7$ is Li, Na, K, Rb or Cs, or

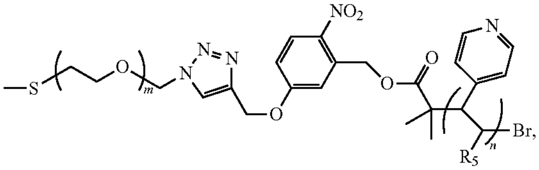

or,

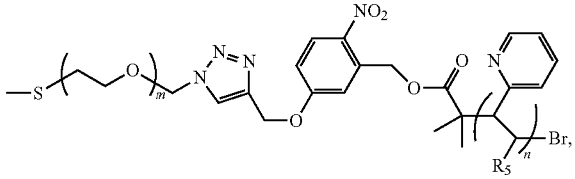

wherein, 2≤m≤20.

Optionally, in the above quantum dot material provided by the embodiment of the present disclosure, the quantum dot includes at least one of CdS, CdSe, ZnSe, InP, PbS, $CsPbCl_3$, $CsPbBr_3$, $CsPbI_3$, CdS/ZnS, CdSe/ZnS, CdSe/ZnSe, InP/ZnS, PbS/ZnS, $CsPbCl_3$/ZnS, $CsPbBr_3$/ZnS, $CsPbI_3$/ZnS, or ZnTeSe/ZnSe.

Accordingly, an embodiment of the present disclosure further provides a manufacturing method for a light-emitting device, including: forming a first electrode on a substrate; forming a carrier film layer on the first electrode, a surface of the carrier film layer having a first electrical polarity; forming a quantum dot film layer on the carrier film layer by using the above quantum dot material provided by the embodiment of the present disclosure, wherein the first ligand of the quantum dot material is configured to ionize in an aqueous solution to cause the quantum dot material to present a second electrical polarity, and the second electrical polarity is the same as the first electrical polarity; irradiating a target area of the quantum dot film layer by using ultraviolet light to cause a first photosensitive group in a first ligand of the target area to break, such that an outer group in the first ligand of the target area is separated from an inner group in the first ligand of the target area; cleaning the quantum dot film layer irradiated by the ultraviolet light by using an aqueous solution to form a patterned quantum dot layer in the target area; and forming a second electrode on the quantum dot layer.

Optionally, in the above manufacturing method provided by the embodiment of the present disclosure, the forming the carrier film layer on the first electrode, the surface of the carrier film layer having the first electrical polarity, specifically is as follows: forming the carrier film layer, the surface itself having the first electrical polarity, on the first electrode; or forming the carrier film layer on the first electrode; and treating the surface of the carrier film layer to make the surface of the carrier film layer have the first electrical polarity.

Optionally, in the above manufacturing method provided by the embodiment of the present disclosure, the cleaning the quantum dot film layer irradiated by the ultraviolet light by using the aqueous solution to form the patterned quantum dot layer in the target area, specifically is as follows: ionizing a first ligand of a non-target area not irradiated by the ultraviolet light in the aqueous solution, to cause a quantum dot material in the non-target area to present a second electrical polarity, washing off the quantum dot material in the non-target area by the aqueous solution through an electrostatic repulsion effect between the quantum dot material in the non-target area and the carrier film layer, and adsorbing, by the inner group of the quantum dot material in the target area, the quantum dot material in the target area on the surface of the carrier film layer, so as to form the patterned quantum dot layer in the target area.

Optionally, in the above manufacturing method provided by the embodiment of the present disclosure, the irradiating the target area of the quantum dot film layer by using the ultraviolet light, specifically includes: blocking the quantum dot film layer by using a mask, wherein the mask includes a light transmittance area and a light blocking area, the light transmittance area corresponds to the target area in the quantum dot film layer, and the light blocking area corresponds to the non-target area in the quantum dot film layer.

Accordingly, an embodiment of the present disclosure further provides a light-emitting device, including a substrate, a first electrode, a carrier film layer, a quantum dot layer and a second electrode which are stacked, wherein the quantum dot layer includes a quantum dot and a second ligand connected to a surface of the quantum dot, the second ligand includes: an inner group coordinated with the quantum dot and a second photosensitive group connected to the inner group, the second photosensitive group is a group reserved after a first photosensitive group in the above quantum dot material provided by the embodiment of the present disclosure is irradiated by ultraviolet light, and the inner group is an inner group in the above quantum dot material provided by the embodiment of the present disclosure.

Optionally, in the above light-emitting device provided by the embodiment of the present disclosure, a structure of the quantum dot material in the quantum dot layer is

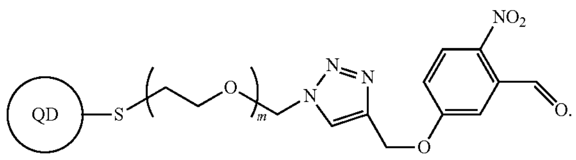

Optionally, in the above light-emitting device provided by the embodiment of the present disclosure, the first electrode is a cathode, the second electrode is an anode, the carrier film layer is an electron transport layer, and the light-emitting device further includes a hole transport layer located between the quantum dot layer and the second electrode; and the inner group is configured to adsorb the quantum dot material of the quantum dot layer on a surface of the electron transport layer.

Optionally, the above light-emitting device provided by the embodiment of the present disclosure, further includes: a hole injection layer located between the hole transport layer and the second electrode.

Optionally, in the above light-emitting device provided by the embodiment of the present disclosure, the first electrode is an anode, the second electrode is a cathode, the carrier film layer is a hole transport layer, and the light-emitting device further includes an electron transport layer located between the quantum dot layer and the second electrode; and the inner group is configured to adsorb the quantum dot material of the quantum dot layer on a surface of the hole transport layer.

Optionally, the above light-emitting device provided by the embodiment of the present disclosure, further includes: a hole injection layer located between the hole transport layer and the first electrode.

Accordingly, an embodiment of the present disclosure further provides a display apparatus, including the above light-emitting device.

DETAILED DESCRIPTION OF THE EMBODIMENTS

In order to make objectives, technical solutions and advantages of embodiments of the present disclosure clearer, the technical solutions of the embodiments of the present disclosure will be described below clearly and completely with reference to accompanying drawings of the embodiments of the present disclosure. Apparently, the described embodiments are part of the embodiments of the present disclosure, not all of them. The embodiments in the present disclosure and features in the embodiments may be mutually combined in the case of no conflict. On the basis of the described embodiments of the present disclosure, all other embodiments obtained by those ordinarily skilled in the art without inventive efforts fall within the scope of protection of the present disclosure.

Unless otherwise defined, technical or scientific terms used in the present disclosure shall have the usual meanings understood by those ordinarily skilled in the art to which the present disclosure pertains. The words "including" or "containing" and the like used in the present disclosure, mean that an element or item preceding the word covers an element or item listed after the word and the equivalent thereof, without excluding other elements or items. "Connection" or "coupling" and similar words are not limited to physical or mechanical connection, but may include electrical connection, whether direct or indirect. The words "inner", "outer", "up", "down" and the like are only used to indicate the relative positional relationship. When the absolute position of the described object changes, the relative positional relationship may also change accordingly.

It should be noted that sizes and shapes of all figures in the accompanying drawings do not reflect a true scale, and only intend to illustrate the content of the present disclosure. The same or similar reference numbers represent the same or similar elements or elements with the same or similar functions from beginning to end.

Figure 1:
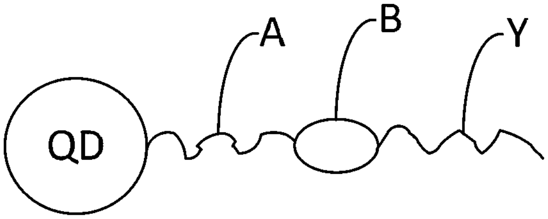
FIG. 1 is a schematic structural diagram of a quantum dot material provided by an embodiment of the present disclosure.

A quantum dot material provided by an embodiment of the present disclosure, as shown in FIG. 1, includes: a quantum dot QD and at least one first ligand connected to a surface of the quantum dot QD.

The first ligand includes: an inner group A connected to the quantum dot QD, a first photosensitive group B connected to the inner group A, and an outer group Y connected to the first photosensitive group B; wherein the inner group A is configured to adsorb the quantum dot material on a surface of a carrier film layer, and the outer group Y is configured to ionize in an aqueous solution to make the quantum dot material electropositive or electronegative.

Figure 2:
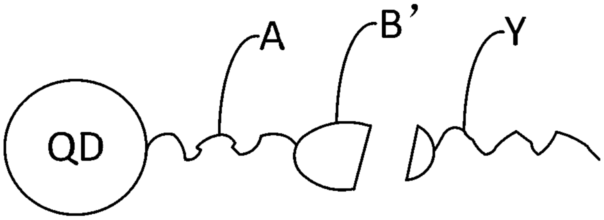
FIG. 2 is a schematic diagram of a quantum dot material corresponding to FIG. 1 after being irradiated by ultraviolet light.

As shown in FIG. 2, the first photosensitive group B is configured to break under irradiation of ultraviolet light, such that the outer group Y is separated from the inner group A. After a surface of the quantum dot QD is irradiated by the ultraviolet light, a second ligand composed of the inner group A and a partial structure (a second photosensitive group B') of the first photosensitive group B is formed on the surface of the quantum dot QD.

According to the above quantum dot material provided by the embodiment of the present disclosure, the carrier film layer is covered with the quantum dot material when a patterned quantum dot layer is formed in a target area by using the quantum dot material. The target area is irradiated by using the ultraviolet light, and the first photosensitive group of the quantum dot material in the target area breaks, such that the outer group is separated from the inner group, that is, the second ligand composed of the inner group and the partial structure of the first photosensitive group is formed on the surface of the quantum dot in the target area. In an area not irradiated by the ultraviolet light, the surface of the quantum dot still includes the first ligand composed of the inner group, the first photosensitive group and the outer group. Because the outer group is configured to ionize in the aqueous solution to make the quantum dot material electropositive or electronegative, the surface of the quantum dot material in the target area is not charged due to the loss of the outer group, while the outer group in the first ligand of the quantum dot material in the area not irradiated by the ultraviolet light may ionize in the aqueous solution to make the quantum dot material electropositive or electronegative. Moreover, because the inner group is configured to adsorb the quantum dot material on the surface of the carrier film layer, acting force between the quantum dot material in the target area and the carrier film layer is strong, and the quantum dot material is tightly adsorbed on the surface of the carrier film layer. In this way, the surface of the carrier film layer may be set to have the same electrical polarity as the quantum dot material after ionization, thereby utilizing a repulsive effect of the same electrical polarity to weaken the acting force between the quantum dot material in the area not irradiated by the ultraviolet light and the carrier film layer. Therefore, the quantum dot material in the area not irradiated by the ultraviolet light may be cleaned by using the aqueous solution. That is, when cleaning with the aqueous solution, the outer group in the area not irradiated by the ultraviolet light ionizes to make the quantum dot material electropositive or electronegative. Due to the fact that the electrical polarity of the surface of the carrier film layer is the same as the electrical polarity of the quantum dot material, the repulsive effect of the same electrical polarity is generated between the quantum dot material in the area not irradiated by the ultraviolet light and the carrier film layer, and the aqueous solution may directly remove the quantum dot material in the area not irradiated by the ultraviolet light, thereby achieving patterning of the quantum dot material in the target area. Moreover, the aqueous solution is used as a developing solution, avoiding the use of a large quantity of organic solvents and reducing generation of organic waste liquid. High-resolution and good-performance quantum dot patterns can be formed by using the quantum dot material provided by the embodiment of the present disclosure.

During specific implementation, in the above quantum dot material provided by the embodiment of the present disclosure, as shown in FIG. 1, a structural formula of the inner group A may be $R_1$-$R_2$-$R_3$, wherein, $R_1$ includes, but is not limited to, —S, —NH, —P or —$PO_2$, and $R_2$ includes, but is not limited to, polyethylene oxide (PEO) or polyethylene glycol (PEG). The polyethylene oxide and the polyethylene glycol can be strongly adsorbed on surfaces of many carriers, so using the polyethylene oxide or the polyethylene glycol as part of the inner group A can help the quantum dot material be adsorbed on the surface of the carrier film layer to form a film. The quantum dot materials shown in FIG. 1 and FIG. 2 both have the inner groups, and thus the quantum dot materials shown in FIG. 1 and FIG. 2 both can be strongly adsorbed on the surfaces of many carriers. However, due to the fact that the quantum dot material shown in FIG. 1 is hydrolyzed to ionize in the aqueous solution to form the same electrical polarity as the surface of the carrier film layer, the structure shown in FIG. 1 after being hydrolyzed to ionize weakens the acting force between it and the surface of the carrier film layer due to an electrostatic repulsion effect, and can be easily washed off by using the aqueous solution. While in the area irradiated by the ultraviolet light, the outer group is separated from the inner group when the first photosensitive group breaks, therefore, the breaking quantum dot material is not charged and adsorbed on the surface of the carrier film layer. In addition, PEO molecules can effectively transport positive carriers but cannot conduct electrons, which promotes injection of the positive carriers and blocks injection of negative carriers, and contributes to the improvement of efficiency of a quantum dot electroluminescent device. $R_3$ is a group obtained after a high-effective and specific chemical reaction of a first group, the high-effective and specific chemical reaction is, for example, a click reaction, and the first group includes, but is not limited to, an azide group, a mercapto group, an amino group, a carboxyl group, an alkyne group, an olefin group, a succinimidyl ester group, a maleimide group, an isothiocyanic acid group, a tetrafluorophenyl ester group, a sulfonated tetrafluorophenyl ester group, a diamide group, a hydroxylamine group or a carbodiimide group. Specifically, taking $R_1$ being —S, $R_2$ being PEO, and the first group being the azide group ($N_3$) as an example, when the azide group ($N_3$) does not undergo the click reaction, a precursor structure of the inner group A is

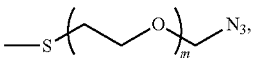

and 2≤m≤20.

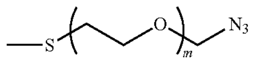

is formed, a mercapto group and an azide group ($N_3$) may be first introduced to two ends of the PEO molecules, and then ligand exchange is performed with quantum dots, with tri-n-octylphosphine, trioctylphosphine oxide, oleylamine, and oleic acid as the ligands, prepared by using a traditional thermal injection method, to replace

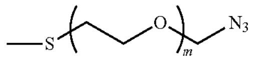

on the surface of the quantum dot QD, that is,

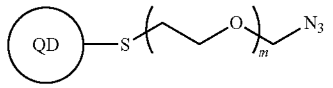

is formed.

During specific implementation, in the above quantum dot material provided by the embodiment of the present disclosure, as shown in FIG. 1, a structural formula of the first photosensitive group B may be

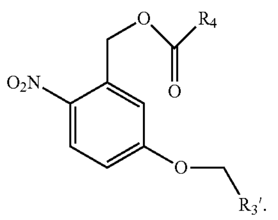

For the material of this structure under irradiation of the ultraviolet light, an ester bond connected to methylene ($CH_2$) on a carbon atom adjacent to nitro (—$NO_2$) on a benzene ring will break (i.e., breaking occurs between O—O bonds), wherein, $R_3$' is a group obtained after a high-effective and specific chemical reaction (such as a click reaction) between the second group and the first group. That is, the first photosensitive group B may bond $R_3$' and $R_3$ together through the high-effective and specific chemical reaction between the second group and the first group, to form

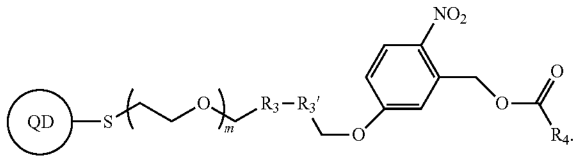

That is, the inner group and the first photosensitive group are bonded to the surface of the quantum dot QD. The second group includes, but is not limited to, an alkyne group, an olefin group, a succinimidyl ester group, a maleimide group, an isothiocyanic acid group, a tetrafluorophenyl ester group, a sulfonated tetrafluorophenyl ester group, a diamide group, a hydroxylamine group or a carbodiimide group, an azide group, a mercapto group, an amino group or a carboxyl group. For example, $R_3$ may be formed through a click reaction by using an azide group (the first group) and $R_3$' may be formed through a click reaction by using an alkyne group (the second group). $R_3$ uses the amino group and $R_3$' may use a succinimidyl ester group or a maleimide group, both of which are linked to a group after a chemical reaction through a specific group. Specifically, $R_3$-$R_3$' is a group obtained after the high-effective and specific chemical reaction (such as a click reaction) between the second group and the first group. The second group and the first group may be any of the following pairs: an azide group—an alkyne group, a mercapto group—an olefin group, a mercapto group—a maleimide group, an amino group—a succinimidyl ester group, an amino group—an isothiocyanic acid group, an amino group—a maleimide group, an amino group—a tetrafluorophenyl ester group, an amino group—a sulfonated tetrafluorophenyl ester group, an amino group—a carboxyl group, a carboxyl group—a diamide group, a carboxyl group—a hydroxylamine group, or a carboxyl group—a carbodiimide group. When the first group uses a group on a left side of each pair above, the second group uses a group on a right side of each pair above. When the first group uses the group on the right side of each pair above, the second group uses the group on the left side of each pair above.

$R_4$ is a group obtained after a polymerization reaction initiated by alkane with halogen atoms as an initiator. The polymerization reaction refers to "atom transfer radical polymerization, namely, ATRP". In the alkane with the halogen atoms, carbon atoms connected to the halogen atoms are further at least connected to two methyl groups and any group. This alkane structure with the halogen atoms has the highest activity as the initiator and is also the most commonly used. Certainly, theoretically, other halogen elements can also replace Br, but Br has the best activity and is also the most commonly used. Therefore, Br is preferred in the embodiment of the present disclosure. For example, the alkane with the halogen atoms may include bromopropane. Specifically, taking the second group being the alkyne group and the alkane with the halogen atoms being bromopropane as an example, a precursor structure of the first photosensitive group B is

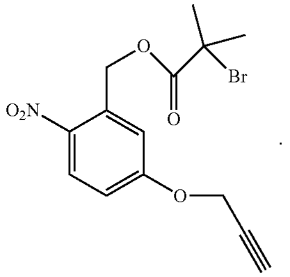 [SMILES: C#CCOc1ccc([N+](=O)[O-])c(COC(=O)C(C)(C)Br)c1]

The azide group ($N_3$) in

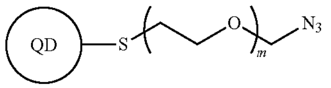

and the alkyne group in

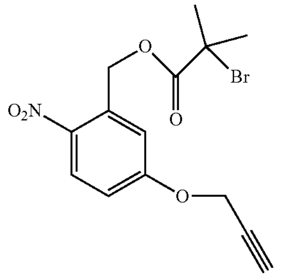 [SMILES: C#CCOc1ccc([N+](=O)[O-])c(COC(=O)C(C)(C)Br)c1]

undergo a high-effective and specific chemical reaction, that is, the first photosensitive group is bonded to the inner group through the high-effective chemical reaction between the specific groups, namely the azide group and the alkyne group. For example, the structure may be

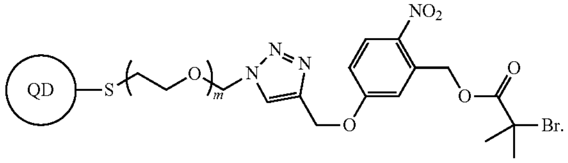

During specific implementation, in the above quantum dot material provided by the embodiment of the present disclosure, as shown in FIG. 1, the outer group Y includes, but is not limited to, polyacrylate or derivatives thereof, derivatives of polystyrene, or polyvinylpyridine. These materials can be hydrolyzed to ionize in the aqueous solution, such that the quantum dot material after ionization presents electropositive or electronegative.

During specific implementation, in the above quantum dot material provided by the embodiment of the present disclosure, as shown in FIG. 1, when the outer group Y is polyacrylate or derivatives thereof, for example, the outer group is

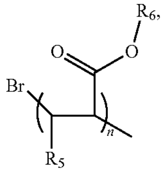

the outer group may polymerize acrylate monomers or derivatives thereof to molecular ends of

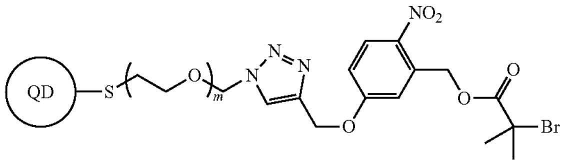

through an atom transfer radical polymerization (ATRP) reaction of the acrylate monomers or the derivatives thereof, to obtain

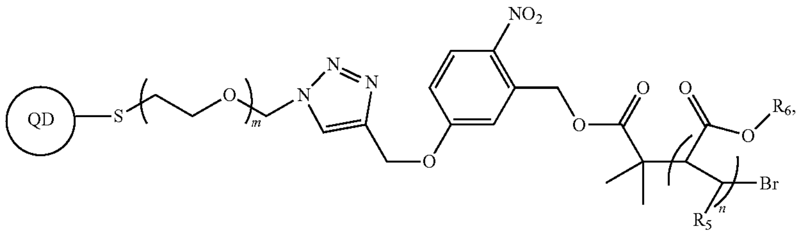

$R_5$ may be H or an alkane group, $R_6$ may be H, or $R_6$ may be

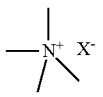

or derivatives thereof, $X^-$ is $F^-$, $Cl^-$, $Br^-$, $I^-$, $ClO_4^-$, SCN or $HSO_3^-$, and n≥3. When $R_6$ is H, the structure is

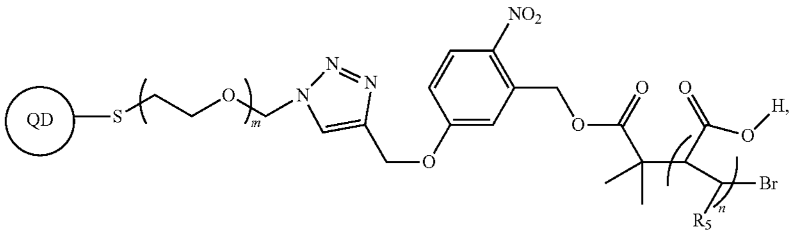

carboxylic acid, in the aqueous solution, connected in parentheses on the right side may ionize away H ions, making the quantum dot material electronegative. When $R_6$ is

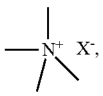

for example, the structure may be

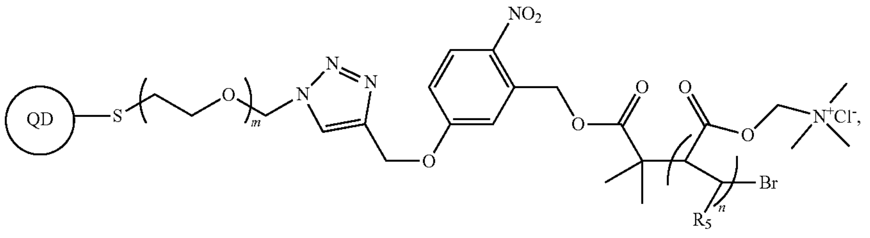

compared with an ester group,

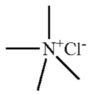

connected in parentheses on the right side is more likely to ionize in the aqueous solution, and

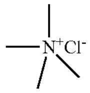

ionizes away $Cl^-$, making the quantum dot material electropositive. Therefore, due to the different structures of $R_6$, first ligands with different degrees of ionization may be obtained, resulting in different electrical polarities of the quantum dot material.

When the outer group may be derivatives of polystyrene, for example, the outer group

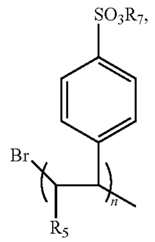

the outer group may polymerize styrene monomers to molecular ends of

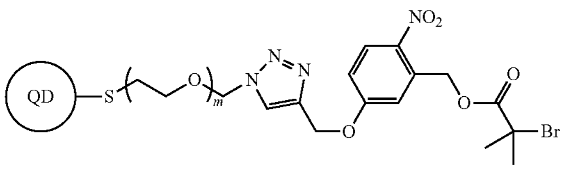

through an atom transfer radical polymerization (ATRP) reaction of derivatives of the styrene monomers. For example, the derivatives of the styrene monomer are styrene sulfonic sodium

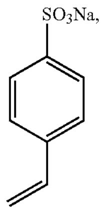

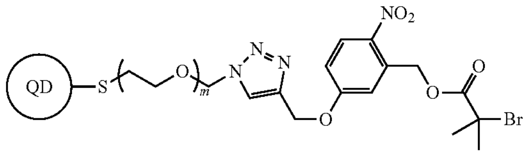 and

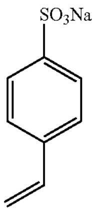

are polymerized to obtain

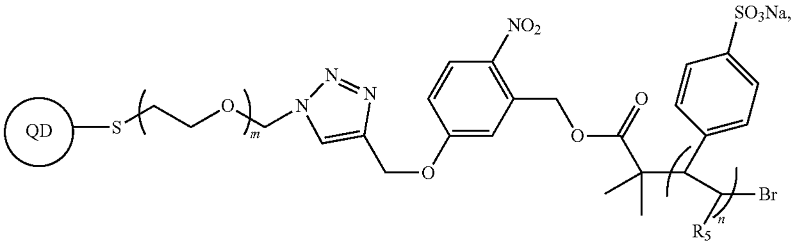

and $R_5$ may be H or an alkane group, and n≥3. Sodium sulfonate, in the aqueous solution, connected to a benzene ring in parentheses on the right side may ionize away Na ions, making the quantum dot material electronegative.

When the outer group may be polyvinylpyridine, for example, the outer group is

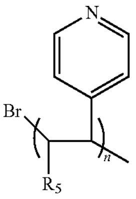 or 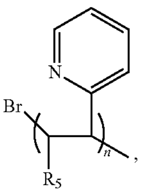, $R_5$ is H or an alkane group, and n≥3. The outer group may polymerize polyvinylpyridine monomers to molecule ends of

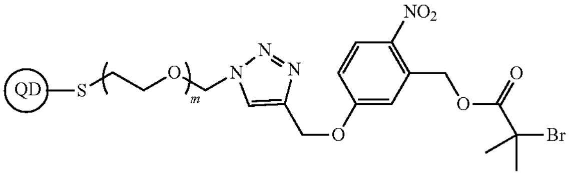

through an atom transfer radical polymerization (ATRP) reaction of the polyvinylpyridine monomers, to obtain

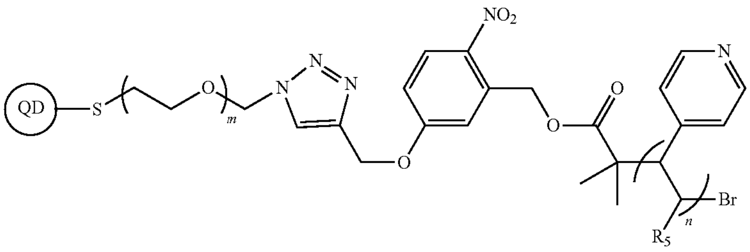 or

-continued

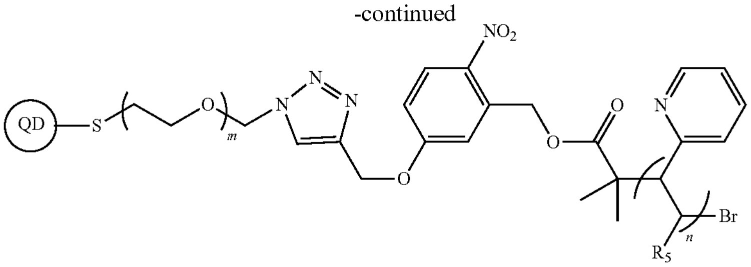

through polymerization. A pyridine group in the parentheses on the right side can be dissolved in an acidic aqueous solution, and $H^+$ in the acidic aqueous solution coordinates with the N atoms in the pyridine group, making molecules electropositive, and making the quantum dot material electropositive.

During specific implementation, in the above quantum dot material provided by the embodiment of the present disclosure, as shown in FIG. 1, the first ligand may be:

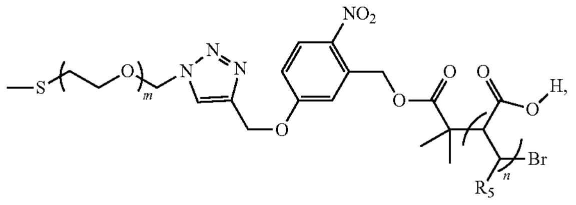

and the corresponding quantum dot material is

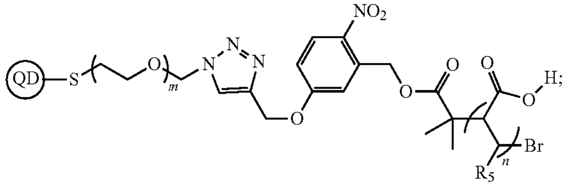

or the first ligand may be

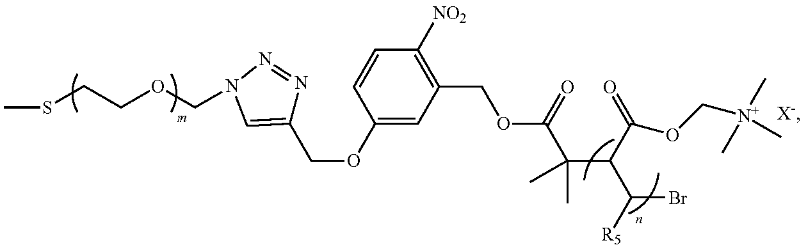

$X^-$ is $F^-$, $Cl^-$, $Br^-$, $I^-$, $ClO_4^-$, $SCN^-$ or $HSO_3^-$, and the corresponding quantum dot material is

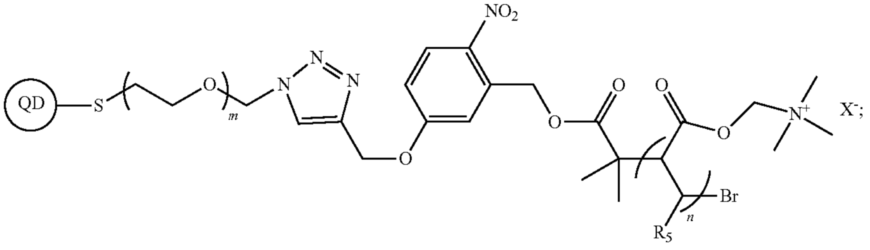

or the first ligand may be

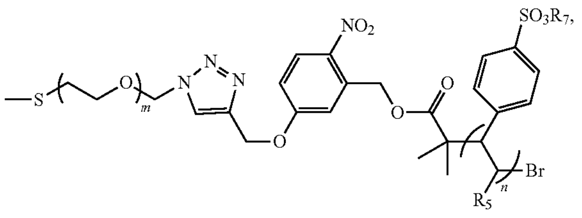
, and the corresponding quantum dot material is

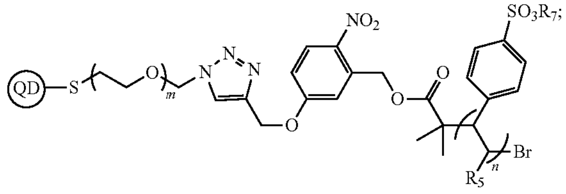
;

or the first ligand may be

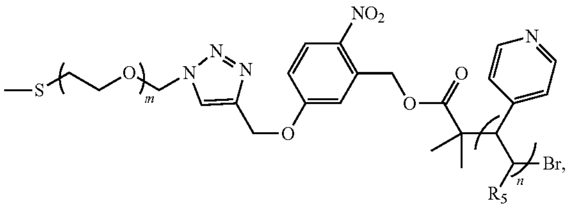
, and the corresponding quantum dot material is

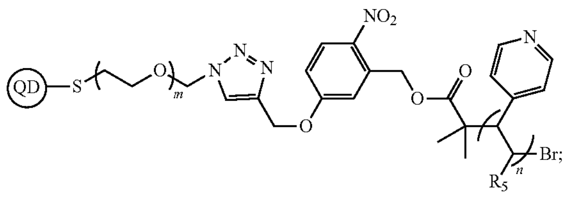
;

or the first ligand may be

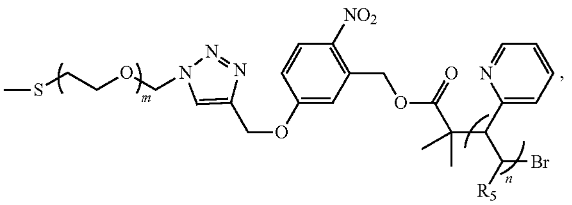
, and the corresponding quantum dot material is

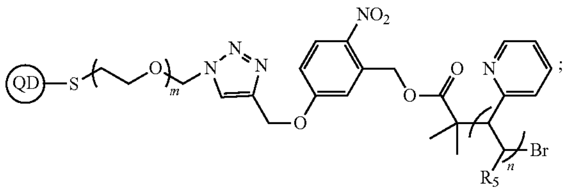
;

wherein, $2 \leq m \leq 20$, and m is a positive integer.

During specific implementation, in the above quantum dot material provided by the embodiment of the present disclosure, as shown in FIG. 1, the quantum dot QD includes, but is not limited to, quantum dots such as CdS, CdSe, ZnSe, InP, PbS, $CsPbCl_3$, $CsPbBr_3$, $CsPbI_3$, CdS/ZnS, CdSe/ZnS, CdSe/ZnSe, InP/ZnS, PbS/ZnS, $CsPbCl_3$/ZnS, $CsPbBr_3$/ZnS, $CsPbI_3$/ZnS, or ZnTeSe/ZnSe.

Figure 3:
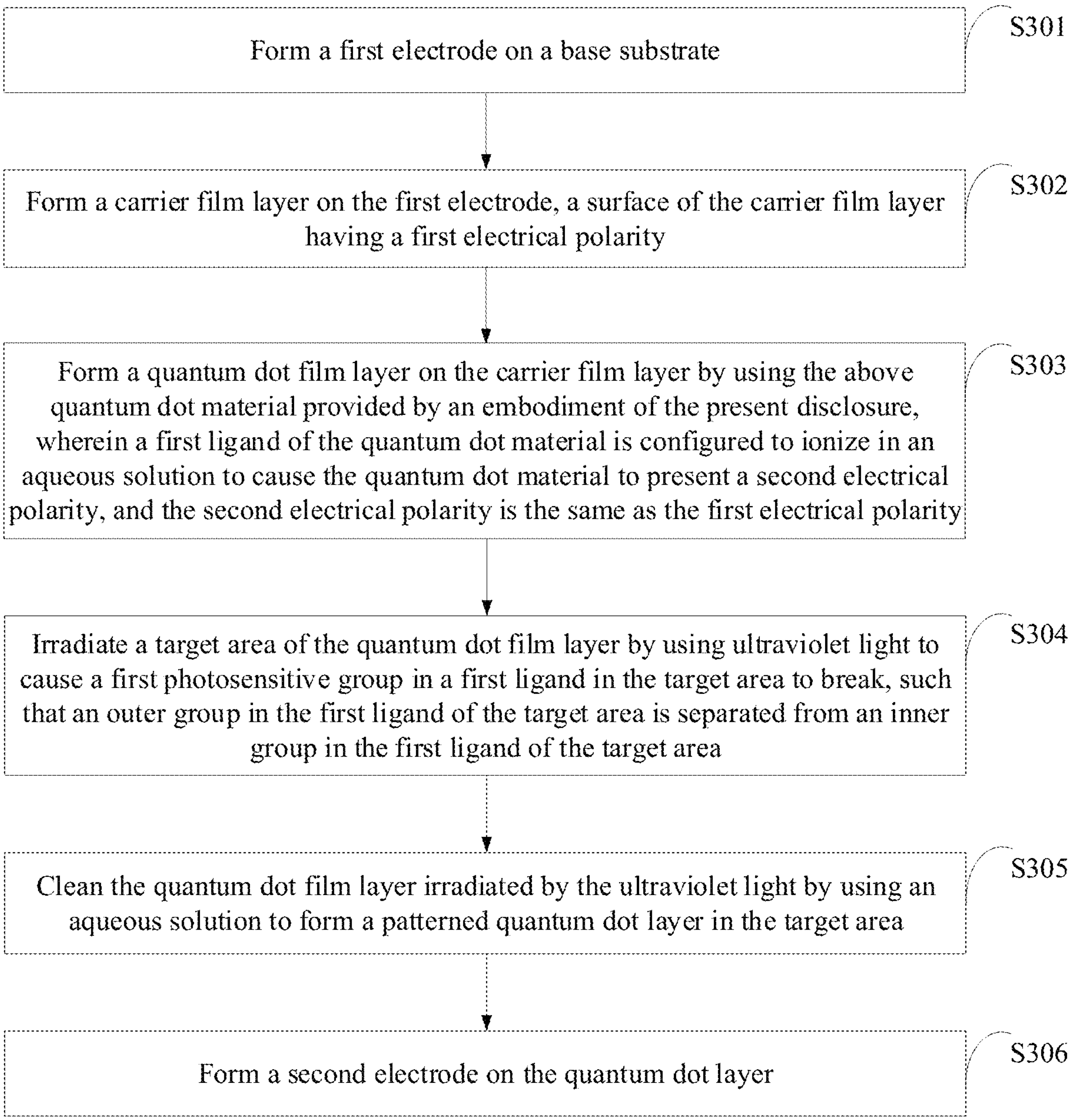
FIG. 3 is a schematic flow diagram of a manufacturing method for a light-emitting device provided by an embodiment of the present disclosure.

Based on the same inventive concept, an embodiment of the present disclosure further provides a manufacturing method for a light-emitting device, as shown in FIG. 3, which may include: S301, a first electrode is formed on a substrate; S302, a carrier film layer is formed on the first electrode, a surface of the carrier film layer having a first electrical polarity; S303, a quantum dot film layer is formed on the carrier film layer by using the above quantum dot material provided by the embodiment of the present disclosure, wherein the first ligand of the quantum dot material is configured to ionize in an aqueous solution to cause the quantum dot material to present a second electrical polarity, and the second electrical polarity is the same as the first electrical polarity; S304, the quantum dot film layer is irradiated by using ultraviolet light to cause a first photosensitive group in a first ligand in a target area to break, such that an outer group in the first ligand of the target area is separated from an inner group in the first ligand of the target area; S305, the quantum dot film layer irradiated by the ultraviolet light is cleaned by using an aqueous solution to form a patterned quantum dot layer in the target area; and S306, a second electrode is formed on the quantum dot layer.

According to the above manufacturing method for the light-emitting device provided by the embodiment of the present disclosure, the carrier film layer is covered with a quantum dot material when the patterned quantum dot layer is formed in the target area by using the quantum dot material shown in FIG. 1 above. The target area is irradiated by using the ultraviolet light, and the first photosensitive group of the quantum dot material in the target area breaks, such that the outer group is separated from the inner group, that is, the second ligand composed of the inner group and the partial structure of the first photosensitive group is formed on the surface of the quantum dot in the target area. In an area not irradiated by the ultraviolet light, the surface of the quantum dot still includes the first ligand composed of the inner group, the first photosensitive group and the outer group. Because the outer group is configured to ionize in the aqueous solution to make the quantum dot material electropositive or electronegative, the surface of the quantum dot material in the target area is not charged due to the loss of the outer group, while the outer group in the first ligand of the quantum dot material in the area not irradiated by the ultraviolet light may ionize in the aqueous solution to make the quantum dot material electropositive or electronegative. Moreover, because the inner group is configured to adsorb the quantum dot material on the surface of the carrier film layer, acting force between the quantum dot material in the target area and the carrier film layer is strong, and the quantum dot material is tightly adsorbed on the surface of the carrier film layer. In this way, the surface of the carrier film layer may be set to have the same electrical polarity as the quantum dot material after ionization, thereby utilizing a repulsive effect of the same electrical polarity to weaken the acting force between the quantum dot material in the area not irradiated by the ultraviolet light and the carrier film layer. Therefore, the quantum dot material in the area not irradiated by the ultraviolet light may be cleaned by using the aqueous solution. That is, when cleaning with the aqueous solution, the outer group in the area not irradiated by the ultraviolet light ionizes to make the quantum dot material electropositive or electronegative. Due to the fact that the electrical polarity of the surface of the carrier film layer is the same as the electrical polarity of the quantum dot material, the repulsive effect of the same electrical polarity is generated between the quantum dot material in the area not irradiated by the ultraviolet light and the carrier film layer, and the aqueous solution may directly remove the quantum dot material in the area not irradiated by the ultraviolet light, thereby achieving patterning of the quantum dot material in the target area. Moreover, the aqueous solution is used as a developing solution, avoiding the use of a large quantity of organic solvents and reducing generation of organic waste liquid. High-resolution and good-performance quantum dot patterns can be formed by using the quantum dot material provided by the embodiment of the present disclosure.

At present, an electroluminescent device may be divided into an upright structure and an inverted structure. A difference between the upright structure and the inverted structure lies in different manufacturing orders of film layers. Specifically, the upright structure is to sequentially form an anode, a hole injection layer, a hole transport layer, a quantum dot layer, an electron transport layer, and a cathode on the substrate, while the inverted structure is to sequentially form an electron transport layer, a quantum dot layer, a hole transport layer, a hole injection layer, and an anode on the substrate.

It should be noted that the embodiment of the present disclosure illustrates the manufacturing method for the light-emitting device in detail by taking the light-emitting device of the inverted structure as an example. Certainly, the embodiment of the present disclosure is also applicable to the manufacturing method for the light-emitting device of the upright structure.

In order to achieve full color display, the quantum dot layer generally includes patterned quantum dots of different colors. The embodiment of the present disclosure takes the quantum dot layer including a first quantum dot layer, a second quantum dot layer, and a third quantum dot layer as an example, to introduce the manufacturing method for the light-emitting device provided by the embodiment of the present disclosure in detail in conjunction with the accompanying drawings.

Taking the quantum dot material being

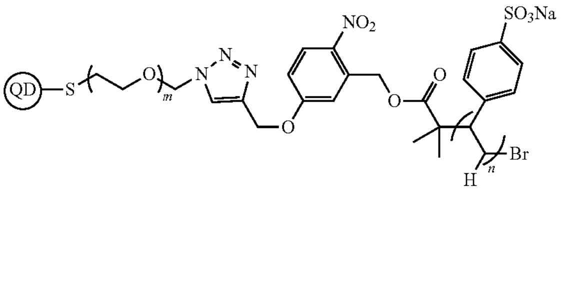

as an example, steps for preparing the quantum dot material of this structure may be as follows.

Firstly, a traditional quantum dot solution is prepared. Taking a quantum dot being InP/ZnS as an example, a first quantum dot solution, a second quantum dot solution, and a third quantum dot solution of different colors are prepared respectively. Specifically, the InP/ZnS quantum dot may be formed through, but not limited to, methods such as a solution phase synthesis method, a hydrothermal method, or a solvothermal method. The original ligand on the surface of the InP/ZnS quantum dot may be traditional tri-n-octylphosphine, trioctylphosphine oxide, oleamine, or oleic acid.

Next, the original ligands on the surface of the InP/ZnS quantum dot are replaced with

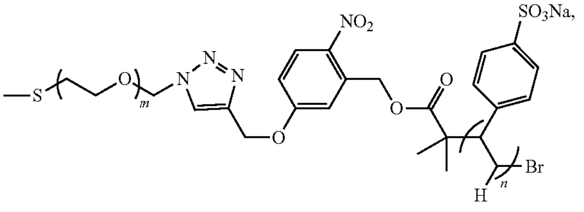

the inner group

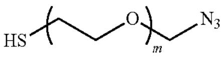

is prepared first, for example, a mercapto group (—SH) and an azide group ($N_3$) are introduced at two ends of polyethylene oxide (PEO) molecules, then, the quantum dot of the InP/ZnS original ligands is taken to be dissolved in DMF (N, N-dimethylformamide), excess

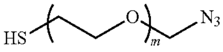

is added, and full stirring is performed at normal temperature. After completing molecule exchange of

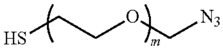

with the original ligands, the solution is added dropwise to a solvent such as toluene (or diethylene glycol) for sedimentation, and centrifugal precipitation is performed. A precipitate is taken to repeat this process for one time to obtain

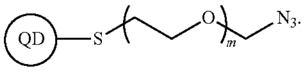

Then, the alkyne group in a material

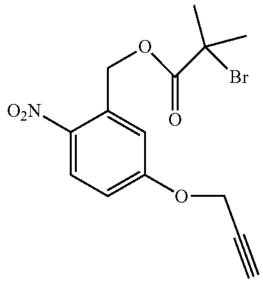 [SMILES: C#CCOc1ccc([N+](=O)[O-])c(COC(=O)C(C)(C)Br)c1]

used to form the first photosensitive group undergoes a click reaction with the azide group ($N_3$) at the end of

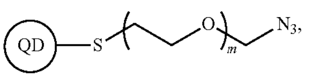

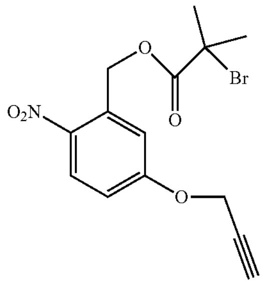

is connected to the end of

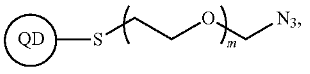

to obtain

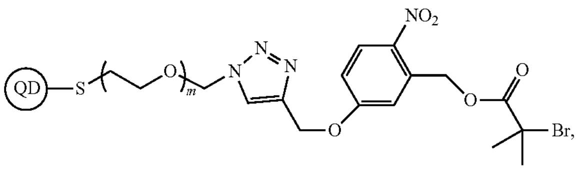

which is specifically performed through the following reaction path:

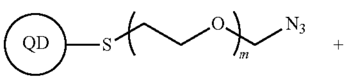

-continued

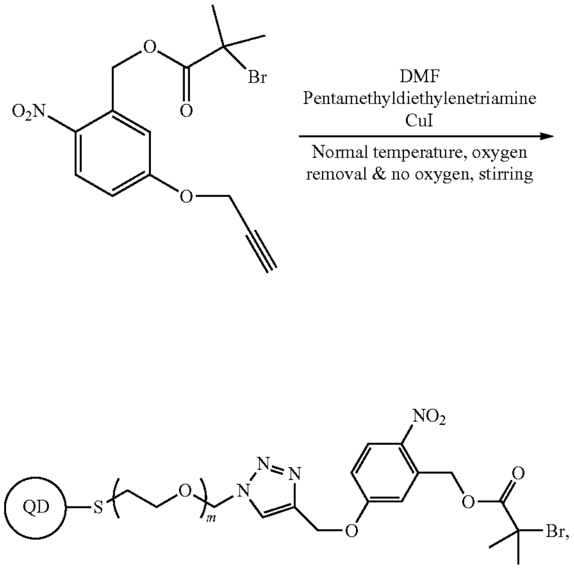

wherein, DMF is N,N-dimethylformamide, and serves as a reaction solvent (organic solvents such as tetrahydrofuran may also serve as a reaction medium); CuI is cuprous iodide, serves as a catalyst and is added in a trace amount (other forms of $Cu^+$ salts may also be used); pentamethylphenylenetriamine is N,N,N,N,N-pentamethyldiethylenetriamine, and complexes with monovalent copper ions ($Cu^+$, cuprous ions) to increase its solubility in the solvent (other molecules complexing with $Cu^+$ may also be selected); and the reaction system needs to remove oxygen, and oxygen should be isolated during the reaction process. Next, taking styrene sulfonic sodium being a monomer molecule (styrene sulfonic sodium molecules may be replaced with any other ethylene monomer molecules) as an example, a styrene sulfonic sodium

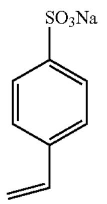

monomer is polymerized to the end of

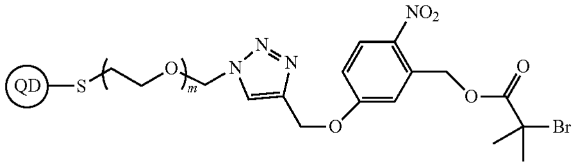

through ATRP, which may be preferably performed through the following reaction path:

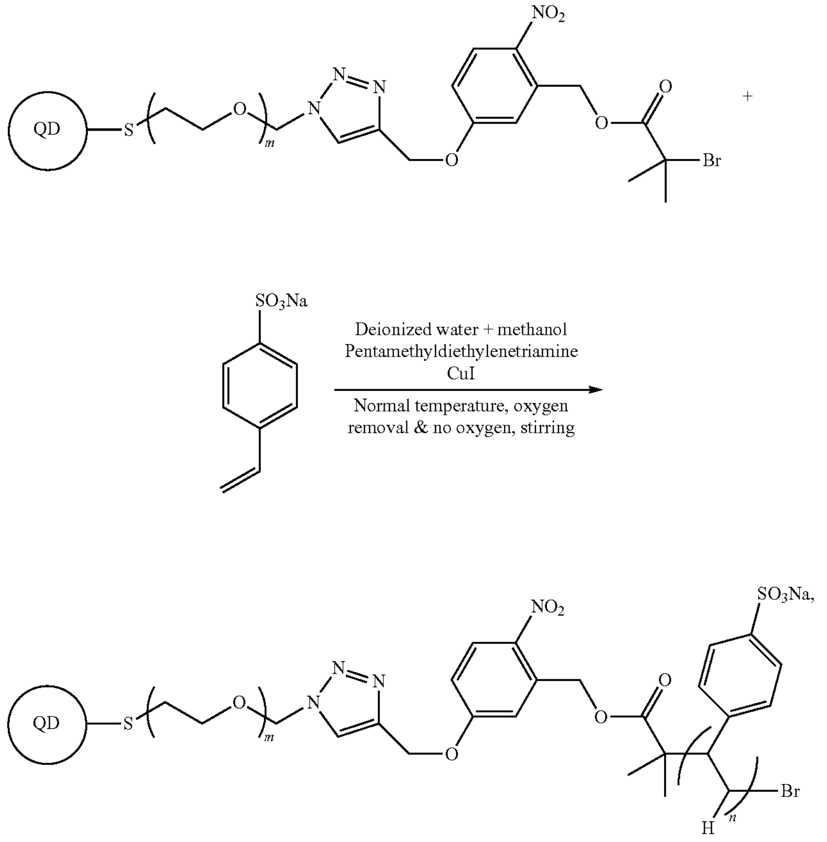

wherein, a reaction condition, preferably, may be a mixed solvent of deionized water+methanol, or deionized water+ DMF, or deionized water+ethanol, etc., as a reaction medium; other conditions are the same as those in the formation of

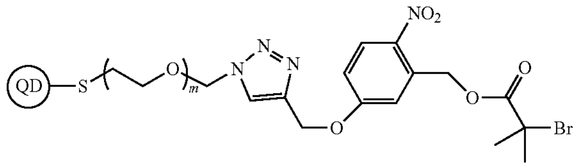

above, and will not be repeated here; and the solvent in this reaction may be replaced with common inorganic or organic solvents such as deionized water and tetrahydrofuran.

A range of values for m in

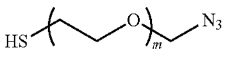

obtained by introducing the mercapto group (—SH) and the azide group ($N_3$) at the two ends of the polyethylene oxide (PEO) molecules may be any positive integer greater than or equal to 2 and less than or equal to 20, and preferably, m may be equal to 2, 3, 4, or 5; a degree of polymerization n of

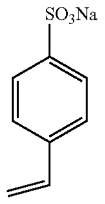

and

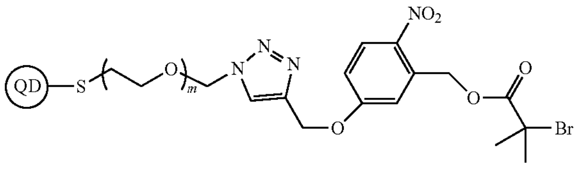

may be determined by the actual situation, a range of values for n may be any positive integer, the degree of polymerization may be controlled by controlling reaction time, and in order to increase the quantity of negative charges in quantum dot material, for example, n may preferably be greater than or equal to 3; and the reactions above in presence of

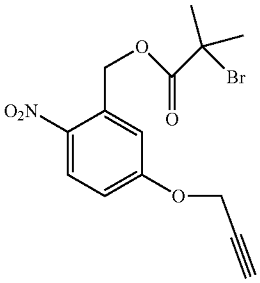 [SMILES: C#CCOc1ccc([N+](=O)[O-])c(COC(=O)C(C)(C)Br)c1]

should be blocked from ultraviolet light to prevent break of

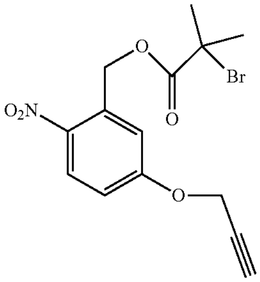 [SMILES: C#CCOc1ccc([N+](=O)[O-])c(COC(=O)C(C)(C)Br)c1]

in advance. Therefore, through the above reaction, a quantum dot material with a structure of

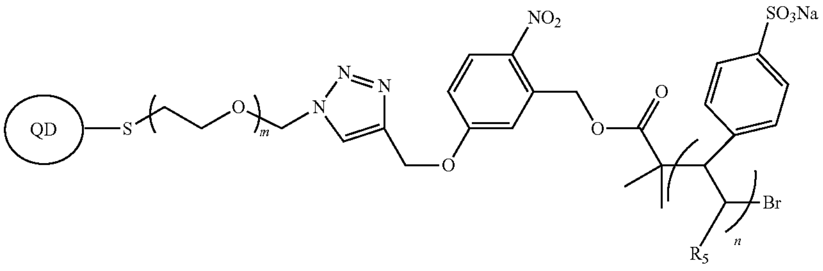

may be obtained. The structure ionizes away $Na^+$ in the aqueous solution to make the quantum dot material electronegative. Different types of sodium polystyrene sulfonate structures may be obtained with different $R_5$ groups.

Figure 4A:
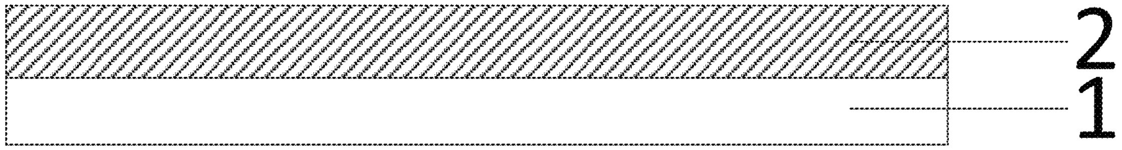
FIG. 4A to FIG. 4N are schematic structural diagrams after executing each manufacturing step of a manufacturing method for a light-emitting device provided by an embodiment of the present disclosure.

Next, as shown in FIG. 4A, a first electrode 2 is formed on the substrate 1. As the embodiment of the present disclosure takes the light-emitting device of the inverted structure as an example, the first electrode 2 is a cathode.

Figure 4B:
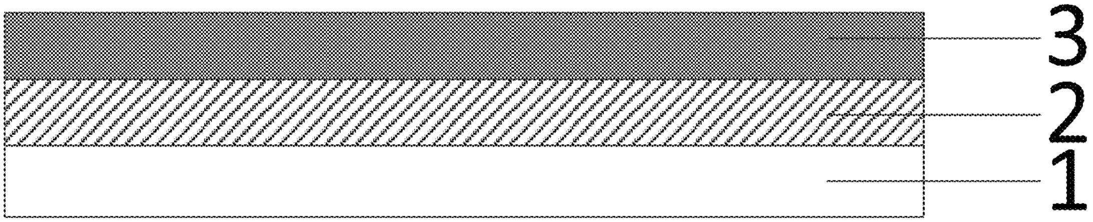

Then, as shown in FIG. 4B, a carrier film layer 3 (i.e., an electron transport layer 11) is formed on the first electrode 2. Commonly used electron transport layer materials are inorganic oxides, such as zinc oxide (ZnO) or magnesium zinc oxide (ZnMgO), which typically presents electronegative on its surface (rich hydroxyl on the surface). Taking the

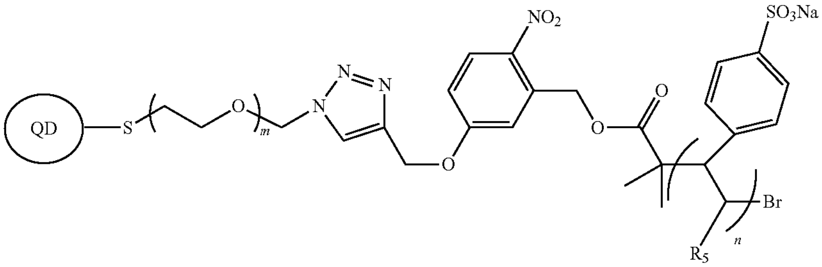

quantum dot material as an example, the quantum dot material is electronegative after ionization in the aqueous solution, so the carrier film layer 3 (i.e., the electron transport layer 11) with electronegativity on its surface may be directly formed on the first electrode 2.

If the surface of the formed electron transport layer is not charged, the carrier film layer 3 (i.e., the electron transport layer 11) is first formed on the first electrode 2, and then the surface of the electron transport layer 11 is treated to make the surface of the electron transport layer 11 have a first electrical polarity (electronegative). Specifically, if the electron transport layer 11 itself is not charged, it may be treated with transient oxygen plasma to make the surface electronegative.

It should be noted that the embodiment of the present disclosure takes the light-emitting device of the inverted structure as an example to illustrate the manufacturing method. When a light-emitting device of an upright structure is used, the quantum dot layer is generally manufactured on a hole transport layer. If a material of the hole transport layer is inorganic, there are usually oxides such as molybdenum oxide $MoO_3$, nickel oxide NiO, or vanadium oxide $V_2O_5$, and the surface usually presents electronegative as well. If the hole transport layer itself does not carry any charge (such as organic hole transport materials), it is also possible to perform transient oxygen plasma treatment on the hole transport layer, similar to the treatment method for the electron transport layer above, to make the surface electronegative.

Figure 4C:
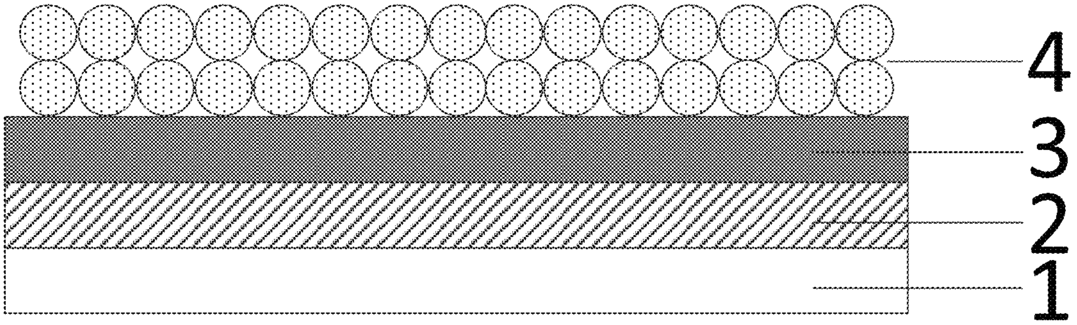

Next, as shown in FIG. 4C, a first quantum dot material film layer 4

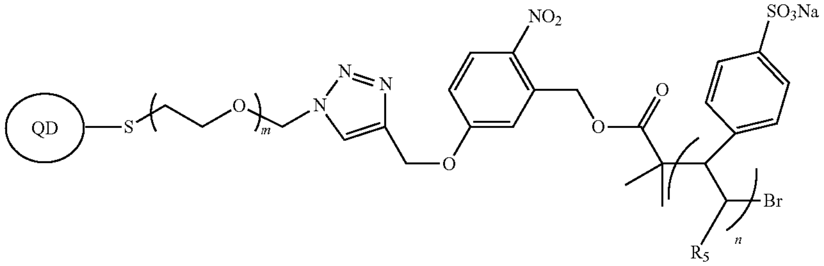

is formed on the carrier film layer 3.

Figure 4D:
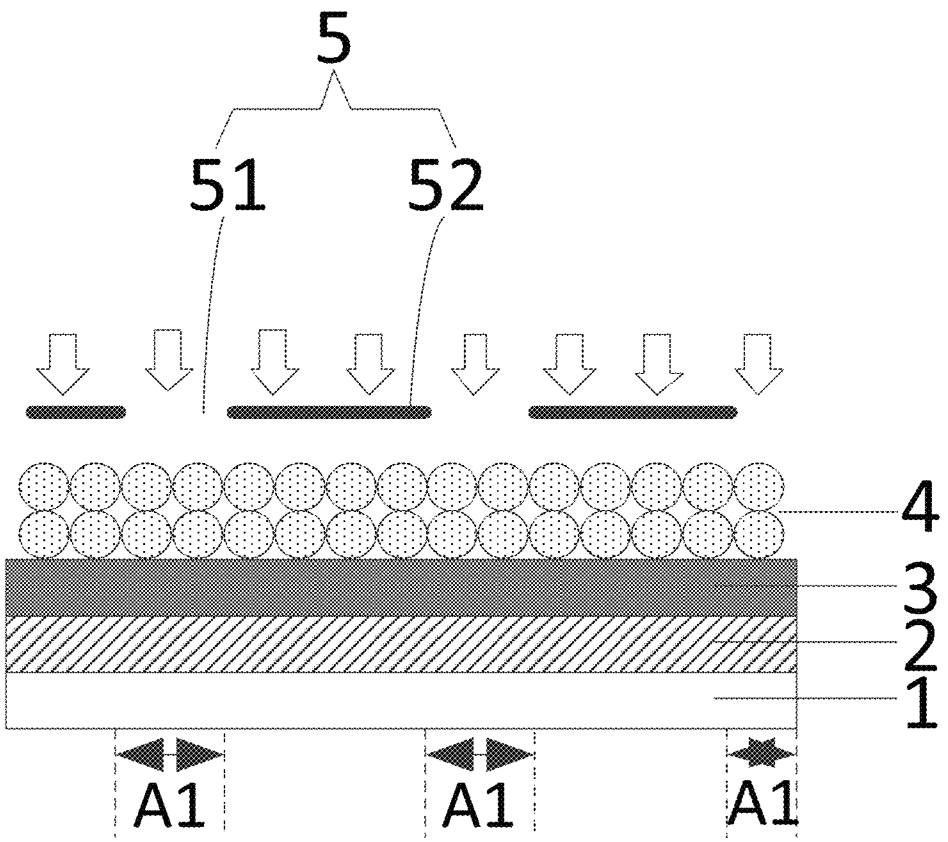

Next, as shown in FIG. 4D, the first quantum dot material film layer 4 is blocked by using a mask 5. The mask includes a light transmittance area 51 and a light blocking area 52, the light transmittance area 51 corresponds to a first target area A1 in the first quantum dot material film layer 4, and the light blocking area 52 corresponds to a non-target area in the first quantum dot material film layer 4. The first photosensitive group in the first quantum dot material

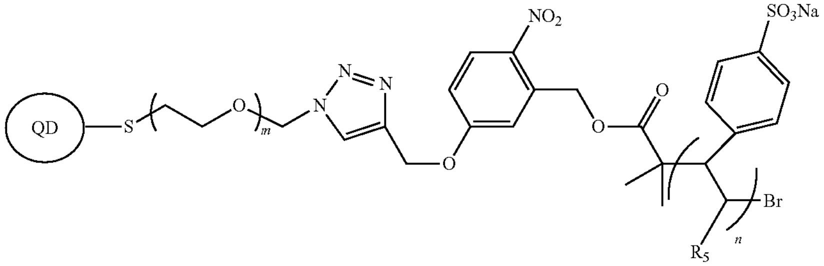

in the first target area A1 breaks between O—O bonds, such that the outer group in the first ligand is separated from the inner group in the first ligand, that is, a structure of the first quantum dot material in the first target area A1 is

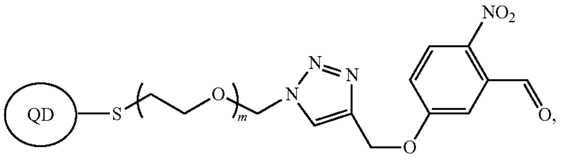

and the structure is not charged. Other non-target areas other than the first target area A1 are not irradiated by the ultraviolet light due to blocking, and therefore, the structure of the first quantum dot material in other non-target areas is still

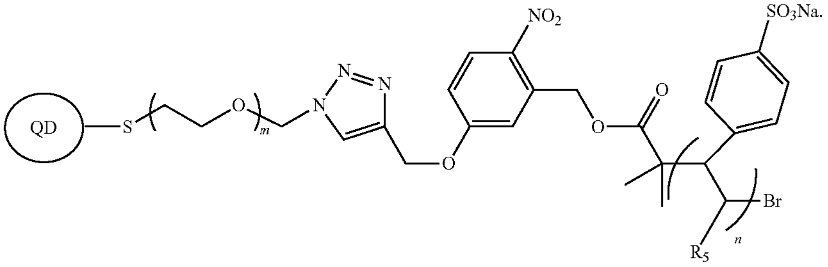

Figure 4E:
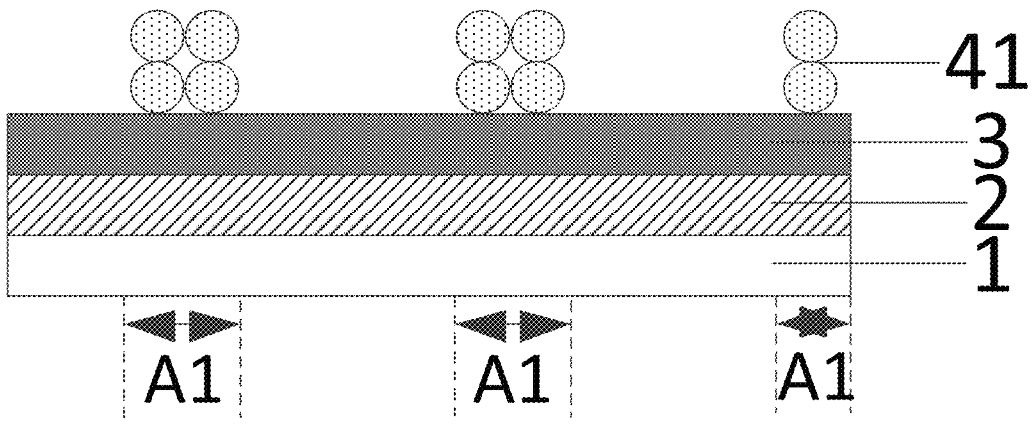

Next, as shown in FIG. 4E, the first quantum dot material film layer 4 irradiated by the ultraviolet light is cleaned with an aqueous solution. The first ligand in the non-target area not irradiated by the ultraviolet light ionizes in the aqueous solution to form

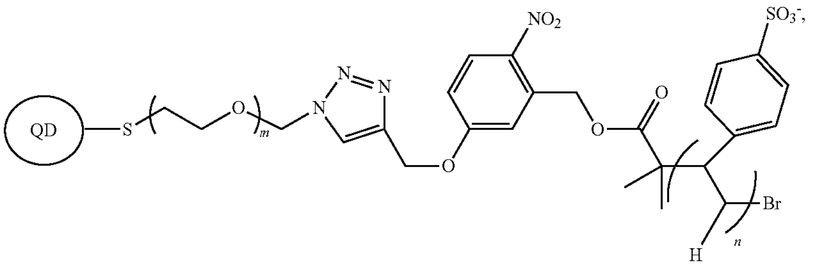

such that the quantum dot material in the non-target area is electronegative. Due to the surface of the carrier film layer 3 (the electron transport layer 11) being electronegative, the first quantum dot material in the non-target area is washed off by the aqueous solution through an electrostatic repulsion effect between the quantum dot material in the non-target area and the carrier film layer 3 (the electron transport layer 11). The inner group of the first quantum dot material in the first target area A1 (PEO can be adsorbed on surfaces of many film layers) causes the quantum dot material to be adsorbed on the surface of the carrier film layer 3 (the electron transport layer 11), that is, the first quantum dot material in the first target area A1 is tightly bound to the carrier film layer 3, and the aqueous solution washes off the first quantum dot material in the non-target area, thereby forming a patterned first quantum dot layer 41 in the first target area A1.

Figure 4F:
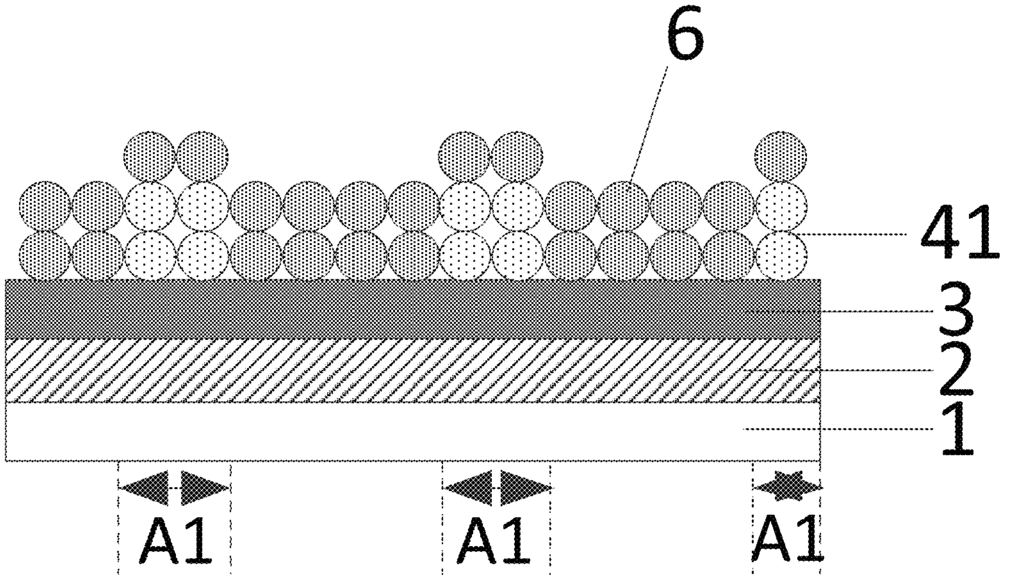

Next, as shown in FIG. 4F, a second quantum dot material film layer 6

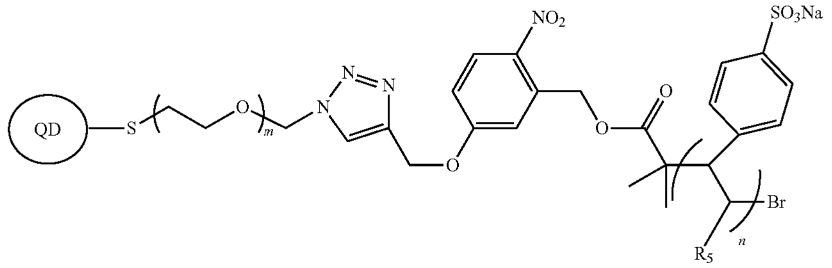

is formed on the first quantum dot layer 41.

Figure 4G:
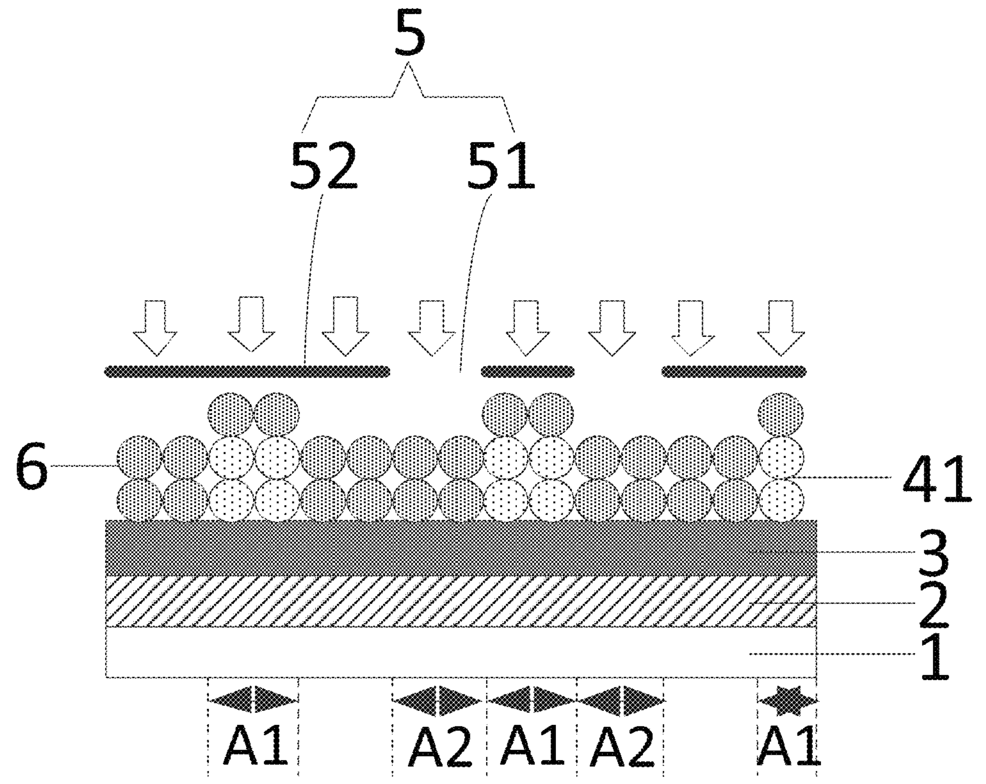

Next, as shown in FIG. 4G, the second quantum dot material film layer 6 is blocked by using a mask 5. The mask includes a light transmittance area 51 and a light blocking area 52, the light transmittance area 51 corresponds to a second target area A2 in the second quantum dot material film layer 6, and the light blocking area 52 corresponds to a non-target area in the second quantum dot material film layer 6. The first photosensitive group in the second quantum dot material

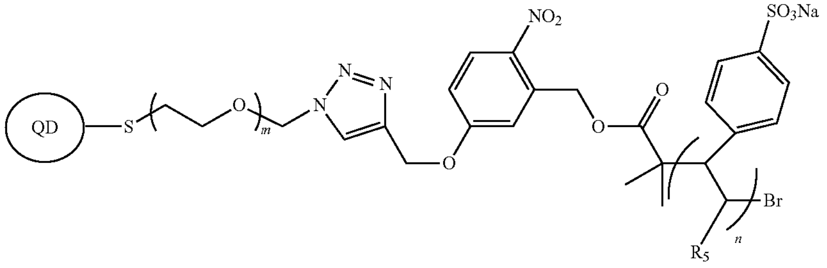

in the second target area A2 breaks between O—O bonds, such that the outer group in the first ligand is separated from the inner group in the first ligand, that is, a structure of the second quantum dot material in the second target area A2 is

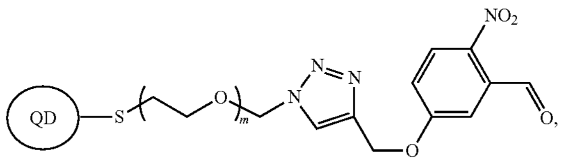

and the structure is not charged. Other non-target areas other than the second target area A2 are not irradiated by the ultraviolet light due to blocking, and therefore, the structure of the second quantum dot material in other non-target areas is still

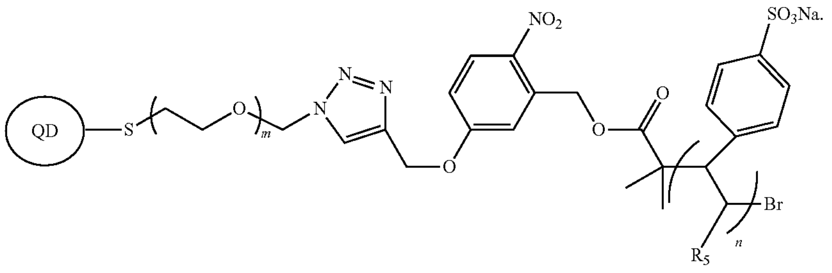

Figure 4H:
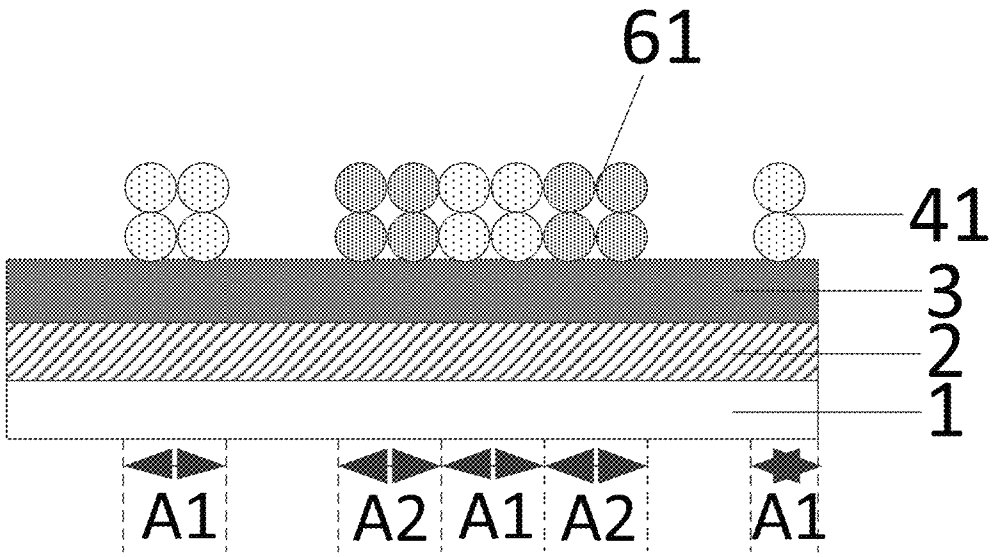

Next, as shown in FIG. 4H, the second quantum dot material film layer 6 irradiated by the ultraviolet light is cleaned with an aqueous solution. The first ligand in the non-target area not irradiated by the ultraviolet light ionizes in the aqueous solution to form

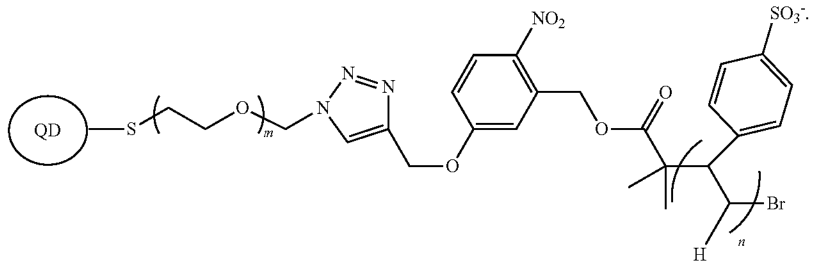

such that the quantum dot material in the non-target area is electronegative. Due to the surface of the carrier film layer 3 being electronegative, the first quantum dot material in the non-target area is washed off by the aqueous solution through an electrostatic repulsion effect between the quantum dot material in the non-target area and the carrier film layer 3. An inner group of the second quantum dot material in the second target area A2 (PEO can be adsorbed on surfaces of many film layers) causes the quantum dot material to be adsorbed on the surface of the carrier film layer 3, that is, the first quantum dot material in the second target area A2 is tightly bound to the carrier film layer 3, and the aqueous solution washes off the second quantum dot material in the non-target area, thereby forming a patterned second quantum dot layer 61 in the second target area A2.

Figure 4I:
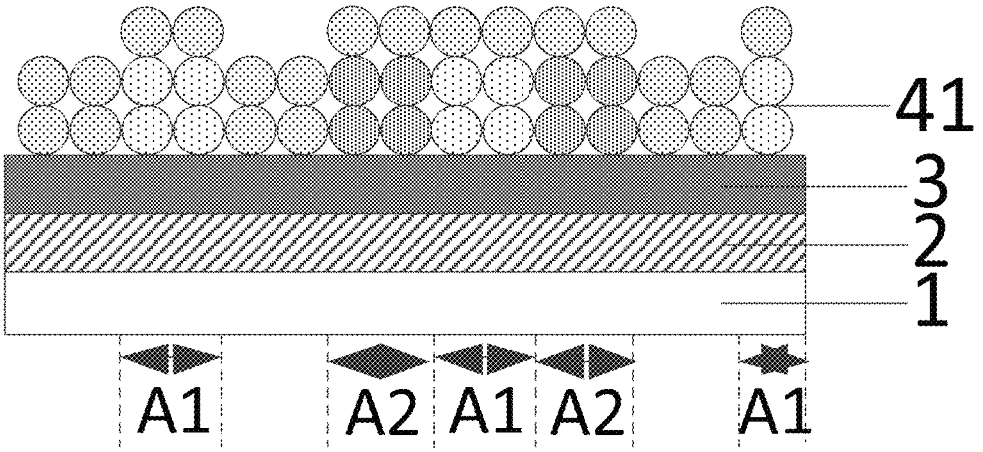

Next, as shown in FIG. 4I, a third quantum dot material film layer 7

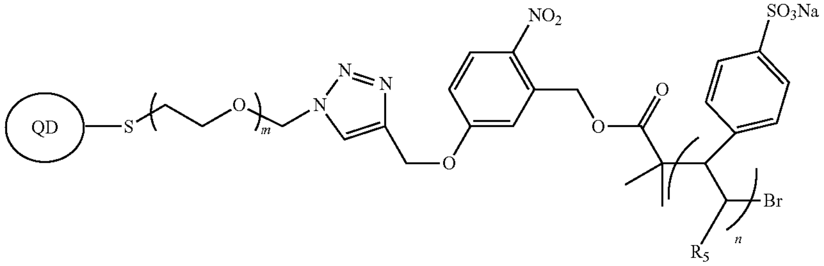

is formed on the second quantum dot layer 61.

Figure 4J:
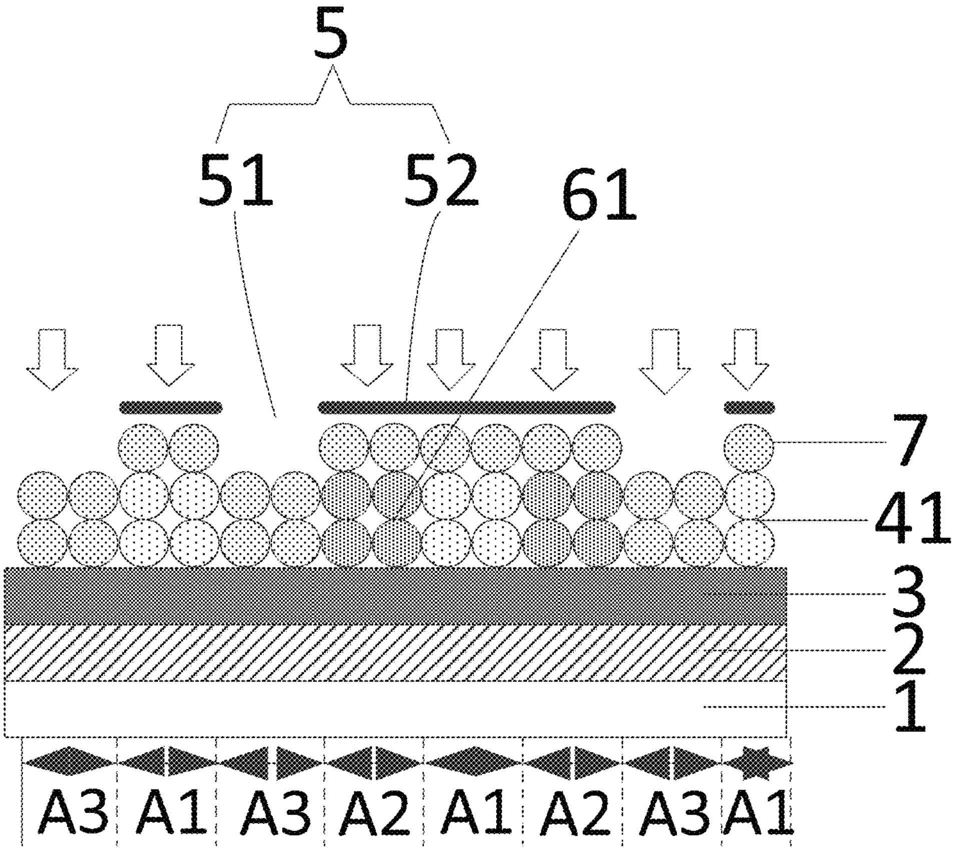

Next, as shown in FIG. 4J, the third quantum dot material film layer 7 is blocked by using a mask 5. The mask includes a light transmittance area 51 and a light blocking area 52, the light transmittance area 51 corresponds to a third target area A3 in the third quantum dot material film layer 7, and the light blocking area 52 corresponds to a non-target area in the third quantum dot material film layer 7. A first photosensitive group in the third quantum dot material

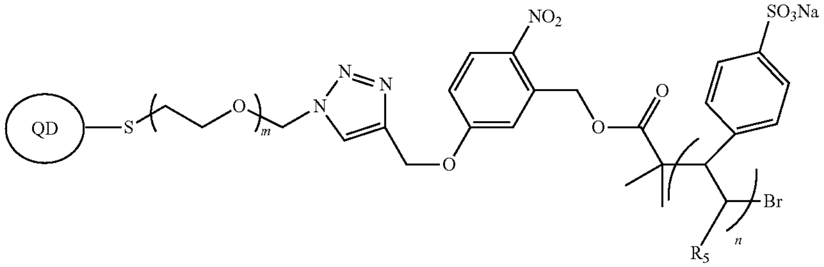

in the third target area A3 breaks between O—O bonds, such that the outer group in the first ligand is separated from the inner group in the first ligand, that is, a structure of the third quantum dot material in the third target area A3 is

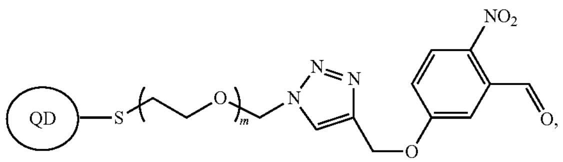

and the structure is not charged. Other non-target areas other than the third target area A3 are not irradiated by the ultraviolet light due to blocking, and therefore, the structure of the third quantum dot material in other non-target areas is still

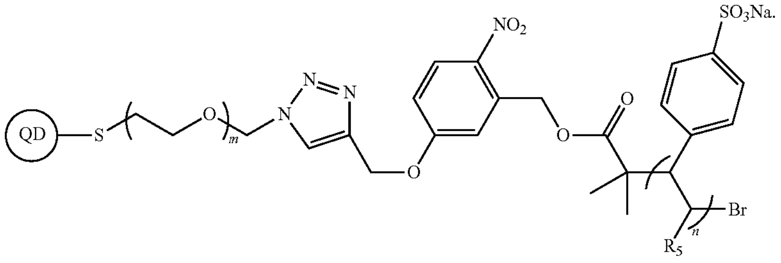

Figure 4K:
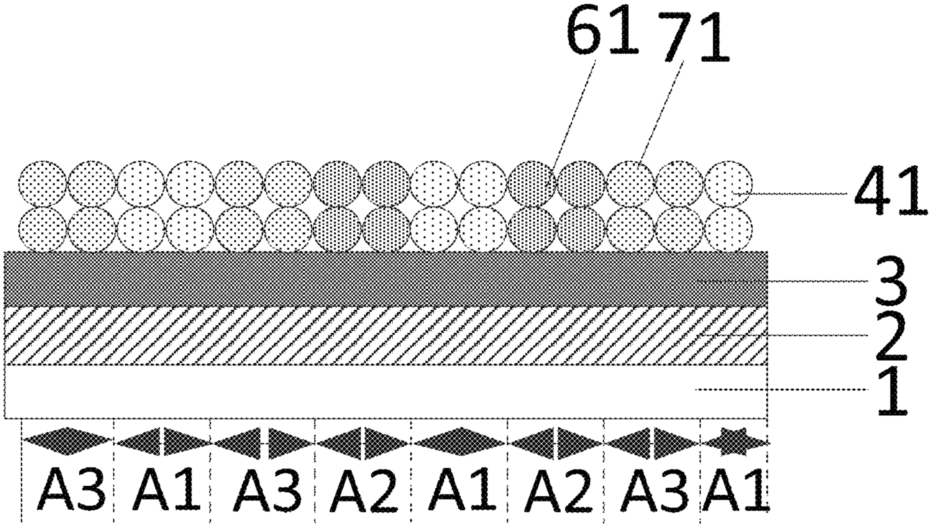

Next, as shown in FIG. 4K, the third quantum dot material film layer 7 irradiated by the ultraviolet light is cleaned with an aqueous solution. The first ligand in the non-target area not irradiated by the ultraviolet light ionizes in the aqueous solution to form

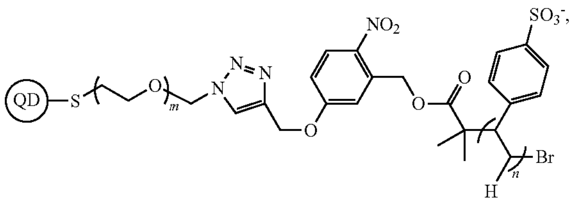

such that the quantum dot material in the non-target area is electronegative. Due to the surface of the carrier film layer 3 being electronegative, the third quantum dot material in the non-target area is washed off by the aqueous solution through an electrostatic repulsion effect between the quantum dot material in the non-target area and the carrier film layer 3. An inner group of the third quantum dot material in the third target area A3 (PEO can be adsorbed on surfaces of many film layers) causes the quantum dot material to be adsorbed on the surface of the carrier film layer 3, that is, the third quantum dot material in the third target area A3 is tightly bound to the carrier film layer 3, and the aqueous solution washes off the third quantum dot material in the non-target area, thereby forming a patterned third quantum dot layer 71 in the third target area A3.

Figure 4L:
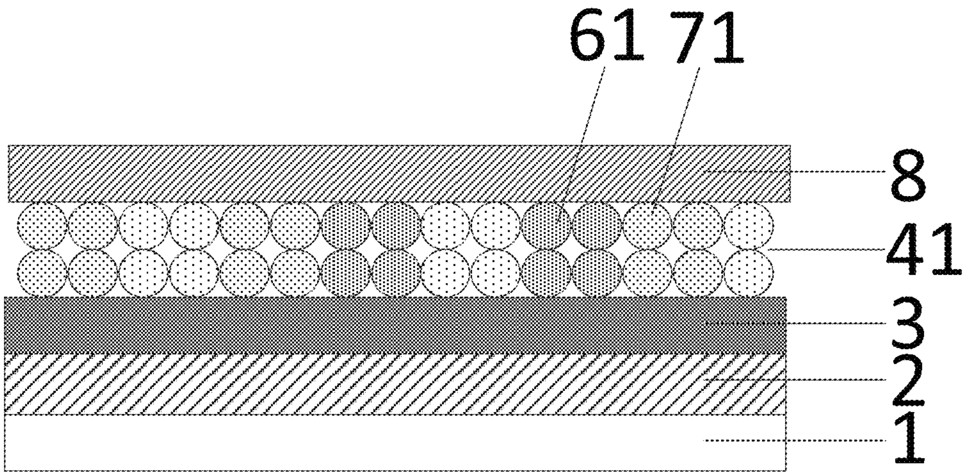

Next, as shown in FIG. 4L, a hole transport layer 8 is formed above a film layer formed with the first quantum dot layer 41, the second quantum dot layer 61, and the third quantum dot layer 71. A material of the hole transport layer 8 may be TFB, etc.

Figure 4M:
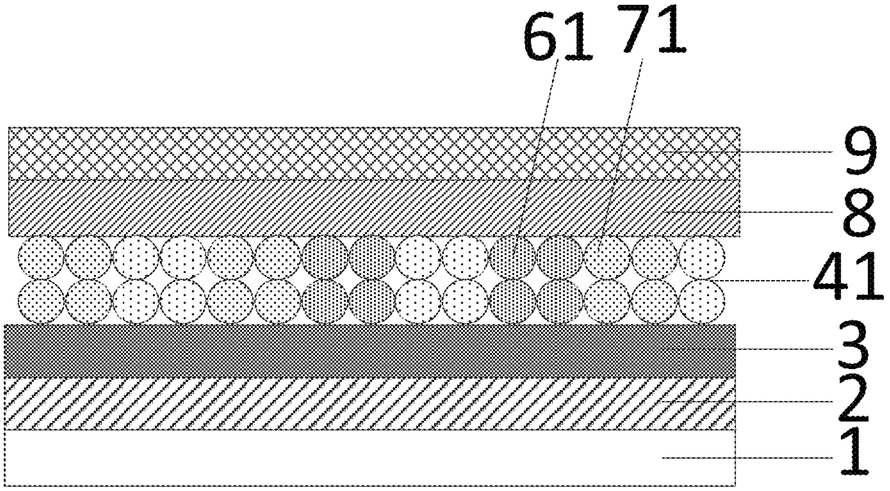

Next, as shown in FIG. 4M, a hole injection layer 9 is formed above the hole transport layer 8, and a material of the hole injection layer 9 may be PEDOT. PSS, etc.

Figure 4N:
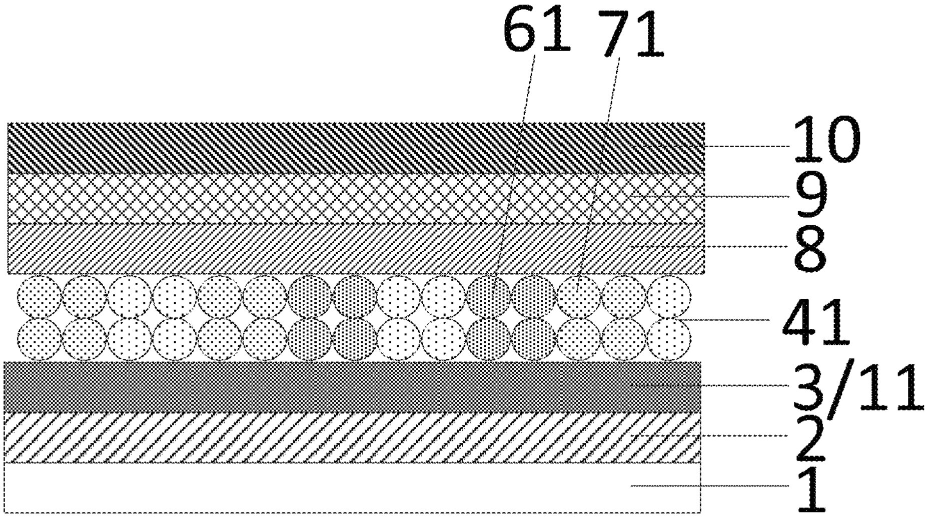

Next, as shown in FIG. 4N, a second electrode 10 (an anode) is formed above the hole injection layer 9.

During specific implementation, the embodiment of the present disclosure takes the inverted structure as an example. After the anode is manufactured, the embodiment of the present disclosure further includes an encapsulation process, a cutting process, and a bonding process of the light-emitting device, all of which are the same as the prior art and will not be repeated here.

Specifically, the preparation method for each film layer in the above light-emitting device includes, but is not limited to, one or more of a spin coating method, an evaporation method, a chemical vapor deposition method, a physical vapor deposition method, a magnetron sputtering method, and the like.

During specific implementation, a color of light emitted by the first quantum dot layer, a color of light emitted by the second quantum dot layer, and a color of light emitted by the third quantum dot layer in the embodiment of the present disclosure are red, green and blue respectively. In this way, the embodiment of the present disclosure completes a patterning process of a full-color quantum dot through the above patterning method.

It should be noted that the above takes the manufacturing method for the light-emitting device of the inverted structure as an example for illustration, takes the first ligand of the quantum dot material being electronegative after ionization and the surface of the carrier film layer (the electron transport layer) being electronegative as an example, and certainly may also take the first ligand of the quantum dot material being electropositive after ionization and the surface of the carrier film layer (the electron transport layer) being electropositive as an example. If the light-emitting device of the upright structure is manufactured, the first ligand of the quantum dot material being electronegative after ionization and the surface of the carrier film layer (the hole transport layer) being electronegative may be taken as an example, certainly, the first ligand of the quantum dot material being electropositive after ionization and the surface of the carrier film layer (the hole transport layer) being electropositive may also be taken as an example, the specific structure of the first ligand of the quantum dot material is selected as needed, and the electrical polarity of the surface of the carrier film layer is correspondingly designed.

Figure 5:
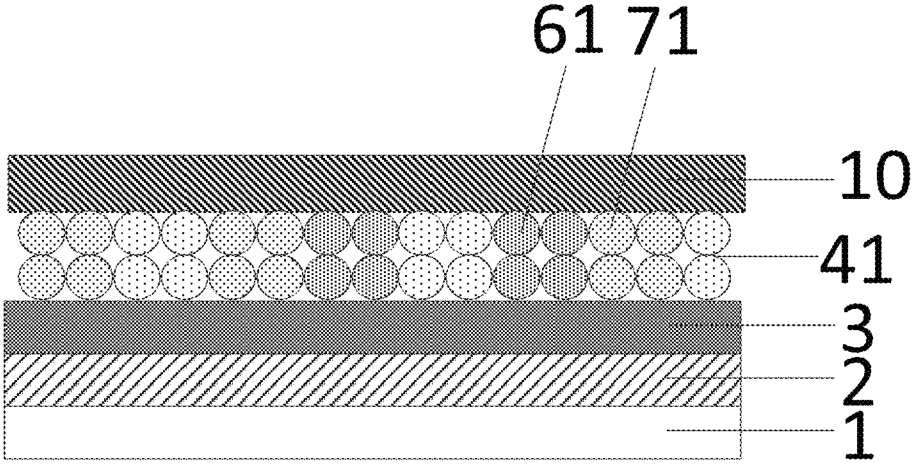
FIG. 5 is a schematic structural diagram of a light-emitting device provided by an embodiment of the present disclosure.

Based on the same inventive concept, an embodiment of the present disclosure further provides a light-emitting device, as shown in FIG. 5, including a substrate 1, a first electrode 2, a carrier film layer 3, a quantum dot layer (41, 61 and 71) and a second electrode 10 which are stacked. The quantum dot layer (41, 61 and 71) includes a quantum dot and a second ligand connected to a surface of the quantum dot, and the second ligand includes: an inner group coordinated with the quantum dot and a second photosensitive group connected to the inner group. The second photosensitive group is a group reserved after the first photosensitive group in the above quantum dot material provided by the embodiment of the present disclosure is irradiated by ultraviolet light, and the inner group is an inner group in the above quantum dot material provided by the embodiment of the present disclosure. For example, the quantum dot material in the quantum dot layer (41, 61, and 71) is a structure after breaking of the first photosensitive group after

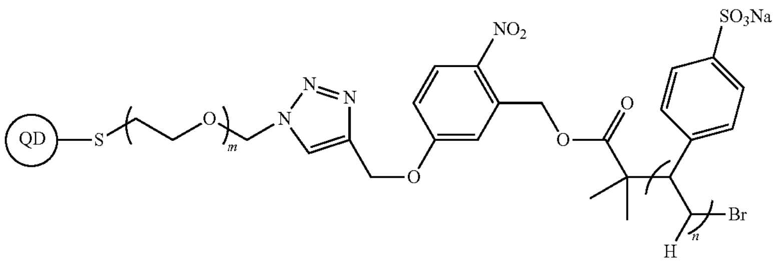

irradiated by the ultraviolet light, that is, the structure of the quantum dot material in the quantum dot layer (41, 61, and 71) is

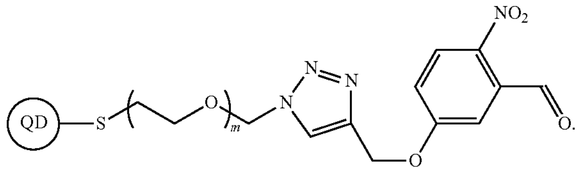

Specifically, as shown in FIG. 5, PEO molecules in the structure

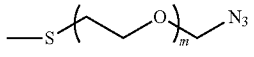

of the quantum dot layer can effectively transport positive carriers without conducting electrons, and play a role in promoting injection of the positive carriers and blocking injection of negative carriers, which helps to improve efficiency of a quantum dot electroluminescent device.

During specific implementation, in the above light-emitting device provided by the embodiment of the present disclosure, as shown in FIG. 4N, the first electrode 2 is a cathode, and the second electrode 10 is an anode, that is, the light-emitting device is of an inverted structure, the carrier film layer 3 is an electron transport layer 11, and the light-emitting device further includes a hole transport layer 8 located between the quantum dot layer (41, 61, and 71) and the second electrode 10. The inner group

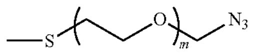

is configured to adsorb the quantum dot material of the quantum dot layer (41, 61, and 71) on a surface of the electron transport layer 11.

During specific implementation, the above light-emitting device provided by the embodiment of the present disclosure, as shown in FIG. 4N, further includes: a hole injection layer 9 located between the hole transport layer 8 and the second electrode 10.

Figure 6:
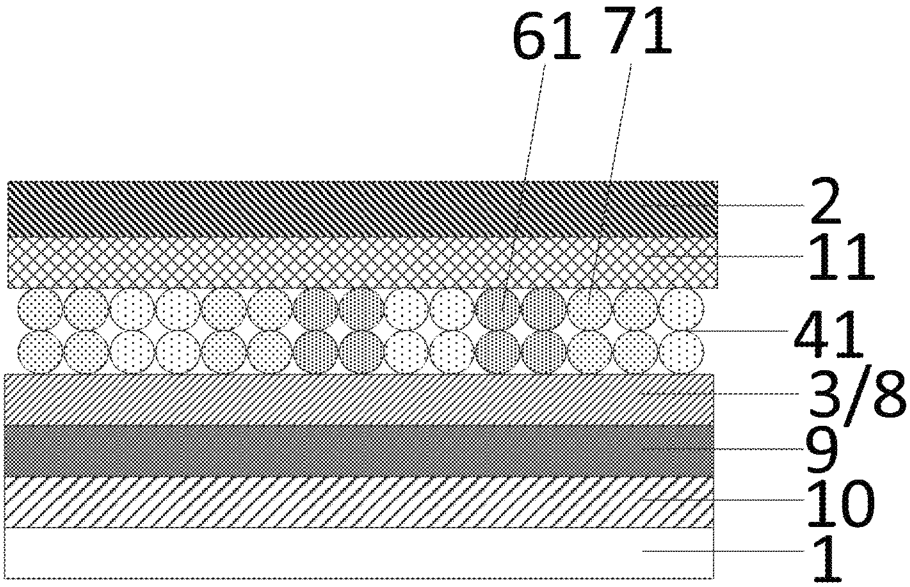
FIG. 6 is a specific schematic structural diagram of a light-emitting device corresponding to FIG. 5.

During specific implementation, in the above light-emitting device provided by the embodiment of the present disclosure, as shown in FIG. 6, the first electrode 2 is an anode, the second electrode 10 is a cathode, that is, the light-emitting device is of an upright structure, the carrier film layer 3 is a hole transport layer 8, and the light-emitting device further includes an electron transport layer 11 located between the quantum dot layer (41, 61, and 71) and the second electrode 10. The inner group

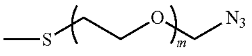

is configured to adsorb the quantum dot material of the quantum dot layer (41, 61, and 71) on a surface of the hole transport layer 8.

During specific implementation, the above light-emitting device provided by the embodiment of the present disclosure, as shown in FIG. 6, further includes: a hole injection layer 9 located between the hole transport layer 8 and the first electrode 2.

It should be noted that a principle of light emitting of the above light-emitting device is as follows: holes in the anode and electrons in the cathode are transported to a light-emitting layer (the quantum dot layer) to be compounded for light emitting. Due to a difference in energy level barriers between the anode and the light-emitting layer, as well as between the cathode and the light-emitting layer, transporting of the electrons and the holes is difficult, and a transporting rate and quantity of the electrons and a transporting rate and quantity of the holes are also greatly different. Therefore, in order to balance concentrations of the electrons and the holes, generally, the hole injection layer and the hole transport layer are arranged between the light-emitting layer (the quantum dot layer) and the anode, and the electron transport layer is arranged between the light-emitting layer (the quantum dot layer) and the cathode. Certainly, during specific implementation, it is possible to select which layers are needed according to actual needs.

Specifically, the substrate provided by the embodiment of the present disclosure may include a base substrate, a driving circuit located on the base substrate, and structures such as a passivation layer and a planarization layer located above the driving circuit.

It should be noted that FIG. 4N of the embodiment of the present disclosure illustrates the manufacturing method by taking the light-emitting device being of the inverted structure as an example. Certainly, the quantum dot light-emitting device may also be of an upright structure, as shown in FIG. 6. When the quantum dot light-emitting device is of the upright structure, the difference from the manufacturing of the inverted structure lies in that an anode 10, a hole injection layer 9, a hole transport layer 8, a quantum dot layer (41, 61, and 71), an electron transport layer 11, and a cathode 2 are sequentially formed on the substrate 1, which will not be repeated here. Specifically, the specific preparation process of the light-emitting device of the upright structure may refer to the above preparation method for the light-emitting device of the inverted structure. The only change is the preparation sequence of each film layer, which will not be detailed here.

Light-emitting types of the light-emitting device are not limited in the present disclosure, for example, are not limited to bottom light emission or top light emission.

During specific implementation, the light-emitting device provided by the embodiment of the present disclosure further includes other functional film layers well known to those skilled in the art, which is not detailed here.

Based on the same inventive concept, an embodiment of the present disclosure further provides a display apparatus, including the above light-emitting device provided by the embodiment of the present disclosure. The display apparatus may be: any product or component with a display function, such as a mobile phone, a tablet computer, a television, a display, a notebook computer, a digital photo frame, and a navigator. It should be understood by those ordinarily skilled in the art that the display apparatus should have other essential constituent parts, which is not repeated here and should not be regarded as a limitation to the present disclosure. Principles of the display apparatus for solving the problems are similar to those of the aforementioned light-emitting device, therefore, implementation of the display apparatus may refer to that of the aforementioned light-emitting device, and repetitions are omitted.

According to the quantum dot material, the light-emitting device and the manufacturing method therefor, and the display apparatus provided by the embodiments of the present disclosure, the carrier film layer is covered with the quantum dot material when the patterned quantum dot layer is formed in the target area by using the quantum dot material. The target area is irradiated by using the ultraviolet light, and the first photosensitive group of the quantum dot material in the target area breaks, such that the outer group is separated from the inner group, that is, the second ligand composed of the inner group and the partial structure of the first photosensitive group is formed on the surface of the quantum dot in the target area. In the area not irradiated by the ultraviolet light, the surface of the quantum dot still includes the first ligand composed of the inner group, the first photosensitive group and the outer group. Because the outer group is configured to ionize in the aqueous solution to make the quantum dot material electropositive or electronegative, the surface of the quantum dot material in the target area is not charged due to the loss of the outer group, while the outer group in the first ligand of the quantum dot material in the area not irradiated by the ultraviolet light may ionize in the aqueous solution to make the quantum dot material electropositive or electronegative. Moreover, because the inner group is configured to adsorb the quantum dot material on the surface of the carrier film layer, acting force between the quantum dot material in the target area and the carrier film layer is strong, and the quantum dot material is tightly adsorbed on the surface of the carrier film layer. In this way, the surface of the carrier film layer may be set to have the same electrical polarity as the quantum dot material after ionization, thereby utilizing the repulsive effect of the same electrical polarity to weaken the acting force between the quantum dot material in the area not irradiated by the ultraviolet light and the carrier film layer. Therefore, the quantum dot material in the area not irradiated by the ultraviolet light may be cleaned by using the aqueous solution. That is, when cleaning with the aqueous solution, the outer group in the area not irradiated by the ultraviolet light ionizes to make the quantum dot material electropositive or electronegative. Due to the fact that the electrical polarity of the surface of the carrier film layer is same as the electrical polarity of the quantum dot material, the repulsive effect of the same electrical polarity is generated between the quantum dot material in the area not irradiated by the ultraviolet light and the carrier film layer, the aqueous solution may directly remove the quantum dot material in the area not irradiated by the ultraviolet light, thereby achieving patterning of the quantum dot material in the target area. Moreover, the aqueous solution is used as the developing solution, avoiding the use of a large quantity of organic solvents and reducing generation of organic waste liquid. High-resolution and good-performance quantum dot patterns can be formed by using the quantum dot material provided by the embodiment of the present disclosure.

Although the preferred embodiments of the present disclosure have been described, those skilled in the art can make additional alterations and modifications to these embodiments once they know the basic creative concept. Therefore, the appended claims intend to be explained as including the preferred embodiments and all alterations and modifications falling within the scope of the present disclosure.

Apparently, those skilled in the art can make various modifications and variations to the embodiments of the present disclosure without departing from the spirit and scope of the embodiments of the present disclosure. In this way, if these modifications and variations of the embodiments of the present disclosure fall within the scope of the claims of the present disclosure and their equivalent art, the present disclosure also intends to include these modifications and variations.

What is claimed is:

1. A quantum dot material, comprising: a quantum dot and at least one first ligand connected to a surface of the quantum dot, wherein the first ligand comprises: an inner group connected to the quantum dot, a first photosensitive group connected to the inner group, and an outer group connected to the first photosensitive group; and the inner group is configured to adsorb the quantum dot material on a surface of a carrier film layer, the first photosensitive group is configured to break under irradiation of ultraviolet light, such that the outer group is separated from the inner group, and the outer group is configured to ionize in an aqueous solution to make the quantum dot material electropositive or electronegative.

2. The quantum dot material according to claim 1, wherein a structural formula of the inner group is $R_1$-$R_2$-$R_3$, wherein, $R_1$ comprises —S, —NH, —P or —$PO_2$, $R_2$ comprises polyethylene oxide or polyethylene glycol, $R_3$ is a group obtained after a high-effective and specific chemical reaction of a first group, and the first group comprises an azide group, a mercapto group, an amino group, a carboxyl group, an alkyne group, an olefin group, a succinimidyl ester group, a maleimide group, an isothiocyanic acid group, a tetrafluorophenyl ester group, a sulfonated tetrafluorophenyl ester group, a diamide group, a hydroxylamine group or a carbodiimide group.

3. The quantum dot material according to claim 2, wherein a structural formula of the first photosensitive group is

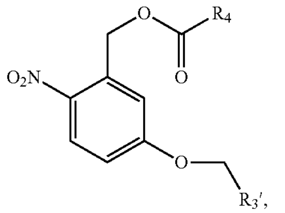

wherein, $R_3$' is a group obtained after a high-effective and specific chemical reaction between a second group and the first group, and the second group comprises an alkyne group, an olefin group, a succinimidyl ester group, a maleimide group, an isothiocyanic acid group, a tetrafluorophenyl ester group, a sulfonated tetrafluorophenyl ester group, a diamide group, a hydroxylamine group or a carbodiimide group, an azide group, a mercapto group, an amino group or a carboxyl group; and $R_4$ is a group obtained after a polymerization reaction initiated by alkane with halogen atoms as an initiator.

4. The quantum dot material according to claim 3, wherein in the alkane with the halogen atoms, carbon atoms connected to the halogen atoms are further at least connected to two methyl groups.

5. The quantum dot material according to claim 4, wherein the alkane with the halogen atoms comprises bromopropane.

6. The quantum dot material according to claim 3, wherein the outer group comprises polyacrylate or derivatives thereof, derivatives of polystyrene, or polyvinylpyridine.

7. The quantum dot material according to claim 6, wherein when the outer group comprises the polyacrylate or the derivatives thereof, the outer group is

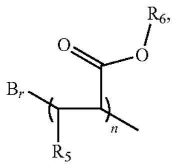

wherein, n≥3, $R_5$ is H or an alkane group, $R_6$ is H, or $R_6$ is

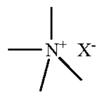

or derivatives thereof, and $X^-$ is $F^-$, $Cl^-$, $Br^-$, $I^-$, $ClO_4^-$, $SCN^-$ or $HSO_3^-$;

when the outer group is the derivatives of the polystyrene, the outer group is

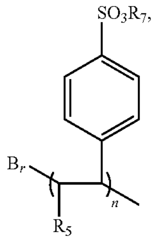

wherein, n≥3, $R_5$ is H or an alkane group, and $R_7$ is Li, Na, K, Rb, or Cs; or when the outer group is the polyvinylpyridine, the outer group is

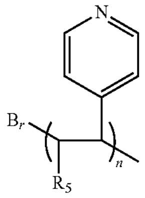 or 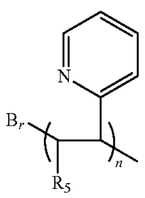, wherein, $R_5$ is H or an alkane group, and n≥3.

8. The quantum dot material according to claim 7, wherein the first ligand comprises:

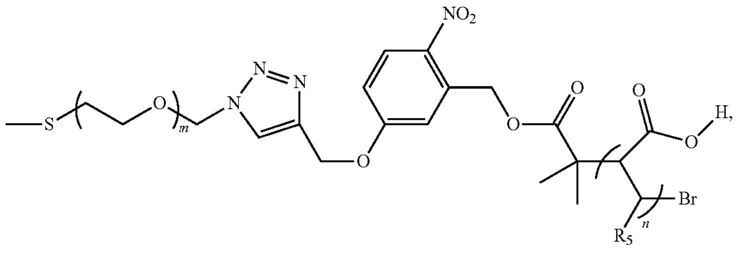 or

-continued

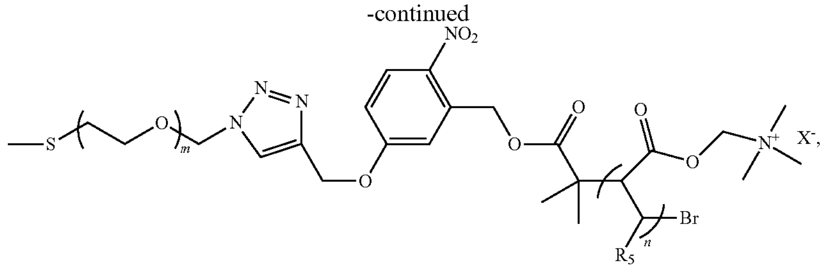

$X^-$ is $F^-$, $Cl^-$, $Br^-$, $I^-$, $ClO_4^-$, $SCN^-$ or $HSO_3^-$, or

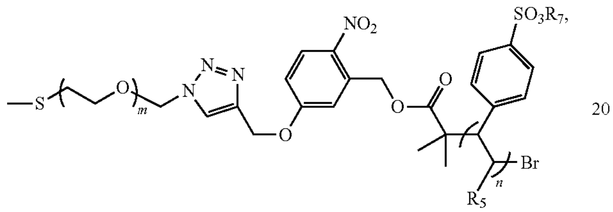

$R_7$ is Li, Na, K, Rb or Cs, or

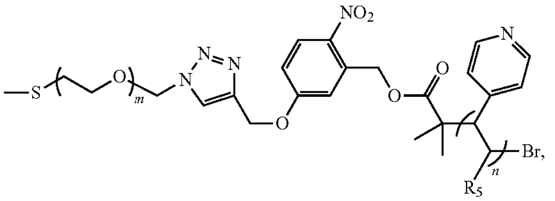

or

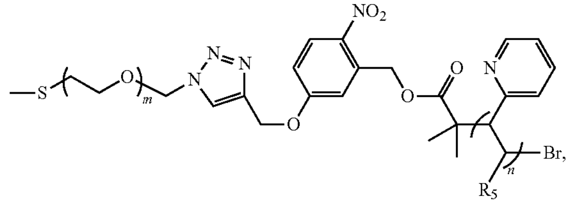

wherein, 2≤m≤20.

9. The quantum dot material according to claim 1, wherein the quantum dot comprises at least one of CdS, CdSe, ZnSe, InP, PbS, $CsPbCl_3$, $CsPbBr_3$, $CsPbI_3$, CdS/ZnS, CdSe/ZnS, CdSe/ZnSe, InP/ZnS, PbS/ZnS, $CsPbCl_3$/ZnS, $CsPbBr_3$/ZnS, $CsPbI_3$/ZnS, or ZnTeSe/ZnSe.

10. A manufacturing method for a light-emitting device, comprising:

forming a first electrode on a substrate;

forming a carrier film layer on the first electrode, wherein a surface of the carrier film layer having a first electrical polarity;

forming a quantum dot film layer on the carrier film layer by using the quantum dot material according to claim 1, wherein the first ligand of the quantum dot material is configured to ionize in an aqueous solution to cause the quantum dot material to present a second electrical polarity, and the second electrical polarity is the same as the first electrical polarity;

irradiating a target area of the quantum dot film layer by using ultraviolet light to cause a first photosensitive group in a first ligand of the target area to break, such that an outer group in the first ligand of the target area is separated from an inner group in the first ligand of the target area;

cleaning the quantum dot film layer irradiated by the ultraviolet light by using an aqueous solution to form a patterned quantum dot layer in the target area; and forming a second electrode on the quantum dot layer.

11. The manufacturing method according to claim 10, wherein the forming the carrier film layer on the first electrode, the surface of the carrier film layer having the first electrical polarity, specifically is as follows:

forming the carrier film layer, the surface itself having the first electrical polarity, on the first electrode; or forming the carrier film layer on the first electrode, and treating the surface of the carrier film layer to make the surface of the carrier film layer have the first electrical polarity.

12. The manufacturing method according to claim 10, wherein the cleaning the quantum dot film layer irradiated by the ultraviolet light by using the aqueous solution to form the patterned quantum dot layer in the target area, specifically is as follows:

ionizing a first ligand of a non-target area not irradiated by the ultraviolet light in the aqueous solution, to cause a quantum dot material in the non-target area to present a second electrical polarity, washing off the quantum dot material in the non-target area by the aqueous solution through an electrostatic repulsion effect between the quantum dot material in the non-target area and the carrier film layer, and adsorbing, by the inner group of the quantum dot material in the target area, the quantum dot material in the target area on the surface of the carrier film layer, so as to form the patterned quantum dot layer in the target area.

13. The manufacturing method according to claim 10, wherein the irradiating the target area of the quantum dot film layer by using the ultraviolet light, specifically comprises:

blocking the quantum dot film layer by using a mask, wherein the mask comprises a light transmittance area and a light blocking area, the light transmittance area corresponds to the target area in the quantum dot film layer, and the light blocking area corresponds to the non-target area in the quantum dot film layer.

14. A light-emitting device, comprising a substrate, a first electrode, a carrier film layer, a quantum dot layer and a second electrode which are stacked, wherein the quantum dot layer comprises a quantum dot and a second ligand connected to a surface of the quantum dot, the second ligand comprises: an inner group coordinated with the quantum dot and a second photosensitive group connected to the inner group, the second photosensitive group is a group reserved after a first photosensitive group in the quantum dot material is irradiated by ultraviolet light, and the first photosensitive group and the inner group are the first photosensitive group and the inner group in the quantum dot material according to claim 1, respectively.

15. The light-emitting device according to claim 14, wherein a structure of the quantum dot material in the quantum dot layer is

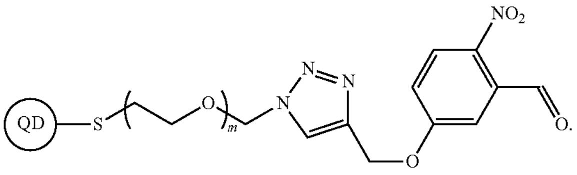

16. The light-emitting device according to claim 14, wherein the first electrode is a cathode, the second electrode is an anode, the carrier film layer is an electron transport layer, and the light-emitting device further comprises a hole transport layer between the quantum dot layer and the second electrode; and the inner group is configured to adsorb the quantum dot material of the quantum dot layer on a surface of the electron transport layer.

17. The light-emitting device according to claim 16, further comprising a hole injection layer between the hole transport layer and the second electrode.

18. The light-emitting device according to claim 14, wherein the first electrode is an anode, the second electrode is a cathode, the carrier film layer is a hole transport layer, and the light-emitting device further comprises an electron transport layer between the quantum dot layer and the second electrode; and the inner group is configured to adsorb the quantum dot material of the quantum dot layer on a surface of the hole transport layer.

19. The light-emitting device according to claim 18, further comprising a hole injection layer between the hole transport layer and the first electrode.

20. A display apparatus, comprising the light-emitting device according to claim 14.

* * * * *